United States Patent [19]
Kawaguchi et al.

[11] Patent Number: 5,606,440
[45] Date of Patent: Feb. 25, 1997

[54] ASSEMBLING METHOD OF FLAT TYPE DISPLAY DEVICE

[75] Inventors: Hisao Kawaguchi; Shigeo Nakabu, both of Nara; Yasunobu Tagusa, Ikoma, all of Japan

[73] Assignee: Sharp Kabushiki Kaisha, Osaka, Japan

[21] Appl. No.: 623,879

[22] Filed: Mar. 29, 1996

Related U.S. Application Data

[62] Division of Ser. No. 54,011, Apr. 29, 1993, Pat. No. 5,528,403.

[30] Foreign Application Priority Data

| Apr. 30, 1992 | [JP] | Japan | 4-111036 |
| Oct. 16, 1992 | [JP] | Japan | 4-278510 |
| Dec. 28, 1992 | [JP] | Japan | 4-349459 |

[51] Int. Cl.$^6$ .................................. G02F 1/1345
[52] U.S. Cl. .................. 349/188; 349/150; 349/152
[58] Field of Search ............... 359/81, 82, 83, 359/87, 88; 257/784, 781; 174/253–255, 260; 361/736, 749, 761, 764, 813; 445/24; 29/832, 834

[56] References Cited

U.S. PATENT DOCUMENTS

| 4,640,581 | 2/1987 | Nakanowatari et al. | 359/88 |
| 4,643,526 | 2/1987 | Watanabe et al. | 359/88 |
| 4,862,153 | 8/1989 | Nakatani et al. | 359/83 |
| 5,087,479 | 2/1992 | McManus et al. | 427/54.1 |
| 5,130,833 | 7/1992 | Mase | 359/88 |
| 5,193,022 | 3/1993 | Hirai | 359/88 |
| 5,261,156 | 11/1993 | Mase et al. | 29/832 |
| 5,283,677 | 2/1994 | Sagawa et al. | 359/88 |
| 5,375,005 | 12/1994 | Komano | 359/83 |
| 5,402,255 | 3/1995 | Nakanishi et al. | 359/88 |
| 5,442,470 | 8/1995 | Hashimoto et al. | 359/88 |

FOREIGN PATENT DOCUMENTS

| 0401746 | 12/1990 | European Pat. Off. |
| 60-225120 | 11/1985 | Japan |
| 63-313127 | 12/1988 | Japan |
| 1237685 | 9/1989 | Japan |
| 1232382 | 9/1989 | Japan |
| 1237591 | 9/1989 | Japan |
| 2127621 | 5/1990 | Japan |
| 3150531 | 6/1991 | Japan |
| 3271791 | 12/1991 | Japan |

OTHER PUBLICATIONS

"Assembling Technology for LCD Device" by Kenzo Hatada, dated Jun. 11, 1992; pp. 162–165.
Patent Abstract Publication No. JP1080931; O. Koichi, et al. Mar. 1989, vol. 13, No. 306.
Patent Abstract Publication No. JP2074092; A. Masaharu, Mar. 1990, vol. 14, No. 255.

(List continued on next page.)

Primary Examiner—William L. Sikes
Assistant Examiner—Tai V. Duong

[57] ABSTRACT

A flat type display device is assembled compactly with high reliability. The flat type display device has a liquid crystal panel having electrode terminals on a peripheral portion of one face of the liquid crystal panel, a flexible wiring board having a drive IC mounted thereon for driving the liquid crystal panel, and a common wiring board having electrode terminals on one face thereof. The flexible wiring board is electrically connected to the electrode terminals of the liquid crystal panel. The common wiring board is electrically connected to the flexible wiring board so as to transmit an input signal, which has been received by the electrode terminals from external, to the drive IC. The liquid crystal panel and the common wiring board are mounted on each other so as to overlap each other in a state that their faces on which their respective electrode terminals are provided are opposed to each other and that the electrode terminals of the common wiring board are located outside of a peripheral portion of the liquid crystal panel. The flexible wiring board is provided in a clearance between the liquid crystal panel and the common wiring board.

11 Claims, 18 Drawing Sheets

OTHER PUBLICATIONS

Patent Abstract Publication No. JP4067126; Y. Osamu, et al., Mar. 1992, vol. 16, No. 266.

Patent Abstract of Japan; Publication No. JP3000166; vol. 15, No. 104 (Mar. 1991).

Patent Abstract of Japan; Publication No. JP63098435; vol. 12, No. 336 (Sep. 1988).

Patent Abstract of Japan; Publication No. JP3294592; vol. 16, No. 133 (Dec. 1991).

Patent Abstract of Japan; Publication No. JP4163926; vol. 16, No. 462 (Sep. 1992).

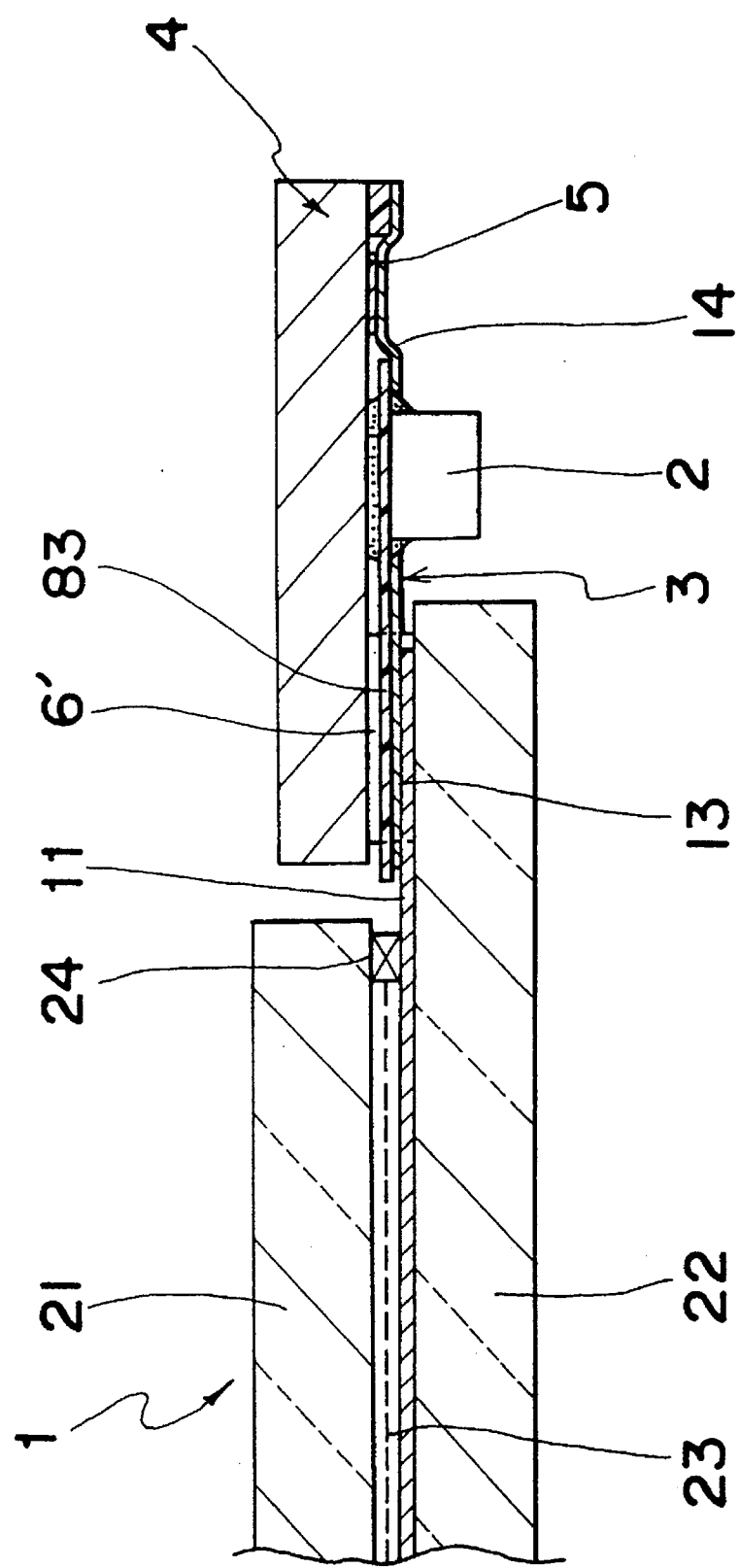

ASSEMBLING METHOD OF FLAT TYPE DISPLAY DEVICE

This application is a divisional of application Ser. No. 08/054,011, filed on Apr. 29, 1993 now U.S. Pat. No. 5,528,403 the entire contents of which are hereby incorporated by reference.

BACKGROUND OF THE INVENTION

1. Field of the Invention

The present invention relates to assembly structures and assembling methods of a flat type display device and, more particularly, to assembly structures and assembling methods in which on the periphery of a display panel such as ones of a liquid crystal display device, EL (electro luminescence) display device, and plasma display device there are mounted a flexible wiring board having ICs (integrated circuits) for driving this display panel as well as a common wiring board for receiving external input signals.

The present invention also relates to apparatus and methods for supplying and curing resin to fabricate assemblies of electronic components or the like.

2. Description of the Prior Art

As shown in FIG. 15, a commonly used liquid crystal panel 101 is so constructed that liquid crystals 123 are sealed by a seal 124 between a pair of glass substrates 121 and 122 and a large number of electrode terminals 111 are disposed on the periphery of one glass substrate 122. In the assembled state, on the periphery of the liquid crystal panel 101 there are also provided a flexible wiring board 103 having drive ICs 102 for driving this liquid crystal panel 101 and a common wiring board 104 for receiving external input signals (assembled panels, hereinafter referred to as "module").

Conventionally, the assembling has been implemented in such a way that the glass substrate 122 and the common wiring board 104 are juxtaposed both on a frame 130 so that their respective electrode terminals 111 and 105 are directed upward and then output terminals 113 and input terminals 114 of the flexible wiring board 103 are connected to the electrode terminals 111 and 105, respectively.

Also, the thickness of the frame 130 is relatively large so as to increase its rigidity, and both the liquid crystal panel 101 and the common wiring board 104 are integrated to the frame 130 by bonding with an adhesive or double-coated adhesive tape, or by fixing with screws or clips (not shown).

Further, as shown in FIG. 16, for the purposes of moisture protection and mechanical reinforcement, the portion around an end face of a glass substrate 121 is often coated with a silicone base protective resin 106 so that protective resin 106 can cover the connecting points between electrode terminals 111 and output terminals 113. The reason why the protective resin 106 is provided by a silicone base material is that it has less effect in shrinkage stress or the like upon the connecting points, compared with epoxy base resins.

For such flat type displays as liquid crystal display devices, it is required to reduce the area of the peripheral region where wiring boards and others are disposed as much as possible, compared with that of the display area where an image is displayed actually. In accordance with this requirement, the aforementioned drive ICs 102 have been developed as those having a lateral chip width of 2 mm or so in FIGS. 15 and 16.

However, the common wiring board 104, as shown in FIG. 14 (as viewed from top), is so constructed that the input terminals 105, 105, . . . for the drive ICs 102, input signal lines 107, 107, . . . laterally extending from each input terminal 105, and common signal lines 108, 108, . . . for connecting the input signal lines 107 with their adjoining drive ICs each through a through hole 109 are provided in a dense arrangement, where the number of the input signal lines 107 is generally ten up to several tens. Accordingly, the width of the peripheral region could be narrowed only to 10 mm or so even if the diameter and interval of the through holes 109 are narrowed to the possible minimums. Thus, the above-described conventional assembly structure cannot allow the area of the peripheral region to be substantially reduced, to a disadvantage.

Also, as shown in FIG. 15, the flexible wiring board 103 is exposed to outside of the panel so that vibrations and impact forces tend to be applied to the flexible wiring board 103 as external forces. When this occurs, the flexible wiring board 103, being flexible itself, would be deformed causing a stress to be applied to the input-side connecting point 105 or the output-side connecting point 103. For this reason, the connecting points are easy to peel off on either the input or output side, resulting in lower reliability.

To solve this problem, as described above, the thickness of the frame 130 is increased in order to increase the rigidity and moreover the panel 101 and the common wiring board 104 are both integrated to the frame 130 by a frame fixing member, e.g. an adhesive. However, the thicknesses of the frame 130 and the frame fixing member in turn would make it difficult to thin the module, inevitably resulting in rather large size of the module. Moreover, increased material costs of the frame 130 and the frame fixing member as well as increased manpower (working hours) required for their integration are also involved, incurring increased cost of the module.

In addition, as shown in FIG. 16, for the purposes of moisture protection and mechanical reinforcement, the protective resin 106 is employed to coat the connecting points between the electrode terminals 111 and the output terminals 113; however, it alone could not suffice.

SUMMARY OF THE INVENTION

The present invention has been developed with a view to substantially solving the above described disadvantages and has for its essential object to provide an assembly structure and assembling method of a flat type device including a panel, such as a liquid crystal panel, having electrode terminals disposed on its periphery, which allows the flat type device to be assembled thin and compactly and yet with low cost and high reliability. Also, the object of the present invention is to provide an apparatus and method for supplying and curing a resin to fabricate such a module as an assembly of electronic components.

In order to achieve the aforementioned object, there is provided an assembly structure of a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, wherein the panel and the common wiring board are mounted on each other so as to overlap each other in a state that the electrode terminals of the common wiring board are located in outer proximity to a peripheral portion of the panel; and the flexible wiring board is provided in a clearance between the panel and the common wiring board.

It is preferable that the drive IC is mounted on a surface of the flexible wiring board opposite to a surface of the flexible wiring board where the common wiring board is mounted in a state that the IC is located outside of the peripheral portion of the panel.

In the assembly structure according to the invention, the panel and the common wiring board are mounted on each other so as to overlap each other; therefore, even if the width of the common wiring board is not below a specified length (approx. 10 mm), the area of the peripheral region is satisfactorily reduced by their overlapping portion. Accordingly, the module i.e. flat type device can be assembled more compactly than was conventionally. In addition, since the electrode terminals of the common wiring board are located in outer proximity to the peripheral portion of the panel, the electrode terminals of the panel and those of the common wiring board can be connected at minimum distances by providing the flexible wiring board in the clearance between the panel and the common wiring board. Consequently, the flat type device can be assembled compactly without the need of drawing the flexible wiring board long around.

Furthermore, generally, the thickness of the drive ICs are smaller than that of the panel. As a result, when the drive ICs are mounted on the surface of the flexible wiring board opposite to the surface of the flexible wiring board where the common wiring board is mounted in the state that the ICs are located outside of the peripheral portion of the panel, the assembly's total thickness is not increased by the thickness of the drive ICs. In consequence, the flat type device can be assembled compactly.

Also, there is provided an assembly structure of a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, wherein the panel and the common wiring board are disposed so as to overlap each other in a state that the electrode terminals of the common wiring board are located in outer proximity to a peripheral portion of the panel; the flexible wiring board is provided at least partially in a clearance between the panel and the common wiring board; and the panel is connected with or mounted integrally with each of the flexible wiring board and the common wiring board via a bonding material.

It is preferable that the bonding material is an anisotropic conductive material which is cured and connected by heat and pressure.

Further, it is preferable that the bonding material is solder.

Furthermore, it is preferable that the bonding material is a resin which is cured by light irradiation.

Moreover, it is preferable that between the panel and the common wiring board there is provided a spacer for holding the panel and the common wiring board spaced at a specified interval.

It is preferable that the spacer is a paste or resin printed and cured at a single or a plurality of points on either one of the panel or the common wiring board.

Further, it is preferable that a substrate of the common wiring board has a flexibility.

Furthermore, it is preferable that the electrode terminals of the common wiring board are provided on a surface of the common wiring board opposite to a surface of the common wiring board which faces the panel; a portion of the flexible wiring board on a common wiring board side is connected to the electrode terminals of the common wiring board by wounding the portion of the flexible wiring board around a peripheral portion of the common wiring board.

Moreover, it is preferable that the flexible wiring board is of a double-layer construction composed of a base material and a wiring material.

Moreover, it is preferable that a portion of the flexible wiring board that has been provided in the clearance between the panel and the common wiring board comprises only a wiring material.

In the assembly structure according to the invention, the panel and the common wiring board are mounted on each other so as to overlap each other; therefore, even if the width of the common wiring board is not below a specified length (approx. 10 mm), the area of the peripheral region is satisfactorily reduced by their overlapping portion. Further, since the panel and the common wiring board are integrally mounted with the bonding material, the need of providing a thick frame or the like is eliminated and therefore the resulting module i.e. the flat type device is reduced in thickness accordingly. In consequence, the device can be assembled thinner and more compactly than was conventionally. Still further, since the electrode terminals of the common wiring board are located in outer proximity to the peripheral portion of the panel, the electrode terminals of the panel and those of the common wiring board can be connected at minimum distances by providing the flexible wiring board in the clearance between the panel and the common wiring board. In consequence, the module can be assembled compactly without the need of drawing the flexible wiring board long around. Moreover, since the panel and the common wiring board are integrally mounted with the bonding material, the strength of the module and therefore its reliability are enhanced and besides any excessive members such as a frame may be omitted. As a result, the material cost and manpower required are reduced accordingly, allowing the device to be assembled with lower cost.

When the aforementioned bonding material is the anisotropic conductive material which will be cured by heat and pressure, the panel and the flexible wiring board are successfully connected together so that the panel and the common wiring board are integrally mounted firmly.

When the aforementioned bonding material is solder, the panel and the flexible wiring board are also successfully connected together so that the panel and the common wiring board are integrally mounted firmly.

When the aforementioned bonding material is the resin which will be cured by light irradiation, the panel and the flexible wiring board are also successfully connected together so that the panel and the common wiring board are integrally mounted firmly.

When the spacer is provided between the panel and the common wiring board to hold them spaced at a specified interval, the panel and the common wiring board can be integrally mounted via the spacer without being obstructed by the thickness of the flexible wiring board.

When the aforementioned spacer is made of a paste or resin printed and cured at a single or a plurality of points on either one of the panel or the common wiring board, the spacer can be simply provided before starting the assembling process.

When the substrate of the common wiring board has a flexibility, the common wiring board is bent at a portion other than the flexible wiring board so as to be approximated to the panel even if the spacer is not provided. Accordingly, the panel and the common wiring board can be integrally mounted on each other with the bonding material without being obstructed by the thickness of the flexible wiring board.

When the electrode terminals of the common wiring board are provided on a surface of the common wiring board opposite to a surface of the common wiring board which faces the panel and the portion of the flexible wiring board on the common wiring board side is connected to the electrode terminals of the common wiring board by drawing it around the peripheral part of the common wiring board, the width of the common wiring board can be reduced by the extent of the electrode terminals. Accordingly, the area of the peripheral region of the panel can be further reduced. As a result of this, the size of a casing member (such as a picture frame) attached to the periphery of the panel can be reduced.

When the flexible wiring board is double-layer structured of a base material and a wiring material, the thickness of the flexible wiring board is less than when a protective layer is provided on the wiring material. In consequence, the thickness of the module is further lessened.

When the portion of the flexible wiring board provided in the clearance between the panel and the common wiring board is composed of only the wiring material, the thickness of the module is further lessened by the extent of the base material.

Also, there is provided an assembly structure of a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, wherein the panel and the common wiring board are mounted on each other so as to overlap each other in a state that the electrode terminals of the common wiring board are located in outer proximity to a peripheral portion of the panel; the flexible wiring board is provided in a clearance between the panel and the common wiring board; and a protective resin is provided in a clearance between the panel and the common wiring board for protecting a connecting portion between the panel and the flexible wiring board and moreover for bonding and integrating the panel, the flexible wiring board, and the common wiring board together.

It is preferable that the protective resin is a photo-setting resin.

Further, it is preferable that the protective resin is an epoxy resin.

Furthermore, it is preferable that a protective plate is provided on a surface of the protective resin that has overflowed the clearance between the panel and the common wiring board.

In the assembly structure according to the invention, the panel and the common wiring board are mounted on each other so as to overlap each other; therefore, even if the width of the common wiring board is not below a specified length (approx. 10 mm), the area of the peripheral region is satisfactorily reduced by their overlapping portion. Accordingly, the module, i.e. flat type device can be assembled more compactly than that was conventionally. Further, the panel, the flexible wiring board, and the common wiring board are integrated with a protective resin, thus eliminating the need of providing a thick frame or the like. The thickness of the module can be lessened accordingly. In consequence, the module can be assembled thin and compactly. Also, since the panel and the common wiring board are such that the electrode terminals of the common wiring board are located in outer proximity to the peripheral portion of the panel, the electrode terminals of the panel and those of the common wiring board can be connected at minimum distances via the flexible wiring board. As a result, the module can be assembled thin and compactly without the need of drawing the flexible wiring board long around. Furthermore, since the panel, the flexible wiring board, and the common wiring board are integrated with a protective resin, the strength of the module and therefore its reliability are enhanced and, besides, any excessive members such as a frame may be omitted. In consequence, the material cost and manpower required are reduced accordingly, allowing the module to be assembled with low cost.

When the protective resin is a photo-setting resin, this resin, after being filled into the clearance between the panel and the common wiring board, is simply cured in a short time by irradiation of ultraviolet rays or the like. As a result, the module can be simply assembled.

Differing from the conventional case, epoxy resins become available as the aforementioned protective resin, in this case, due to the facts that a less coating amount of the protective resin results in a less effect of its shrinkage, and that the panel and the common wiring board are integrated together. When the protective resin is an epoxy resin, the resulting module is further strengthened by virtue of the resin's superiority in rigidity to silicone base resins. In consequence, the reliability is further enhanced.

When a protective plate having a thickness smaller than that of the common wiring board is provided on the surface of the protective resin that has overflowed the portion where the panel and the common wiring board overlap each other, the strength of the module is further enhanced and yet the interstitial paths of moisture to the juncture between the panel and the flexible wiring board are reduced. In consequence, the reliability is further enhanced.

There is provided a method of assembling a flat type display device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of: making an anisotropic conductive material adhering to a single or a plurality of points within the face of the panel on an electrode terminals side of the panel through heating and pressurization; aligning the flexible wiring board with the aforementioned face of the panel; connecting the panel and the flexible wiring board with each other by locally heating and pressurizing part of the anisotropic conductive material that exists in the region where the panel and the flexible wiring board overlap each other; causing the panel and the common wiring board to overlap each other so that the electrode terminals of the common wiring board are located outside of the peripheral portion of the panel and then aligning the flexible wiring board and the common wiring board with each other; mounting and integrating the panel and the common wiring board by locally heating and pressurizing part of the anisotropic conductive material that exists in the region where the panel and the common wiring board overlap each other without intervention of the flexible wiring board; and electrically connecting the flexible wiring board and the common wiring board to each other.

It is preferable that in the step of causing the panel and the common wiring board to overlap each other, a face of the common wiring board having the electrode terminals is positioned so as not to face the panel and wherein in the step of connecting the flexible wiring board and the common wiring board with each other, the portion of the flexible wiring board on the side of the common wiring board is connected to the electrode terminals of the common wiring board by winding the flexible wiring board around a peripheral portion of the common wiring board.

Further, it is preferable that the connection between the panel and the flexible wiring board and the mounting of the panel and the common wiring board are carried out by using a bonding device of a back-pressure beam type infrared irradiation system.

Also, there is provided a method of assembling a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of: aligning the flexible wiring board with the face of the panel and then connecting the panel and the flexible wiring board to each other; applying a protective resin onto the peripheral portion of the panel or onto the common wiring board; causing the panel and the common wiring board to overlap each other so that the electrode terminals of the common wiring board are located in outer proximity to the peripheral portion of the panel and then aligning the panel or the flexible wiring board with the common wiring board; and curing the protective resin, thereby bonding and integrating together the panel, the flexible wiring board, and the common wiring board with the protective resin.

Preferably, the method further comprises the step of: temporarily heating the protective resin to thereby lower viscosity of the protective resin and then cooling the protective resin, after the step of aligning the panel or the flexible wiring board with the common wiring board and before the step of curing the resin.

Also, there is provided a method of assembling a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of: aligning the flexible wiring board with the face of the panel and then connecting the panel and the flexible wiring board to each other; causing the panel and the common wiring board to overlap each other so that the electrode terminals of the common wiring board are located in outer proximity to the peripheral portion of the panel and then aligning the panel or the flexible wiring board with the common wiring board; supplying a protective resin to the vicinity of a clearance between the panel and the common wiring board, thereby filling the protective resin into the clearance by capillary phenomenon; and curing the protective resin, thereby bonding and integrating together the panel, the flexible wiring board, and the common wiring board with the protective resin.

It is preferable that during the process of filling the protective resin into the clearance between the panel and the common wiring board by capillary phenomenon, the protective resin is temporarily heated to thereby lower viscosity of the protective resin and subsequently cooled.

Further, it is preferable that an epoxy resin is used as the protective resin.

There is provided an apparatus for supplying and curing a resin, comprising: a resin supplying unit, having a needle for use of supplying a resin, for supplying a resin in the form of line or multiple dots to specified portions of a member to be supplied with the resin while moving the needle with respect to the member; a heating unit for heating the portions of the member where the resin has been supplied, at specified timing; and a cooling unit for cooling the portions of the member where the resin has been supplied, at specified timing.

Preferably, the apparatus further comprises moving means for moving the aforementioned member in the vertical or horizontal direction.

It is preferable that the heating unit comprises a built-in heater and, on its top, a heating stage that allows the aforementioned member to be placed thereon.

Further, it is preferable that the heating unit comprises a light source for emitting infrared rays, and a slit member for allowing the infrared rays to pass therethrough toward the portions of the member where the resin has been supplied.

Furthermore, the heating unit comprises a light source for emitting infrared rays, and an optical fiber for leading the infrared rays toward the portions of the member where the resin has been supplied.

Moreover, the heating unit is movable along the portions of the member where the resin has been supplied.

It is preferable that the infrared rays are laser beams.

Preferably, the apparatus further comprises an ultraviolet irradiation unit for irradiating ultraviolet rays to the portions of the member where the resin has been supplied, at specified timing.

It is preferable that the ultraviolet irradiation unit comprises a light source for emitting ultraviolet rays and an optical fiber for leading the ultraviolet rays toward the portions of the member where the resin has been supplied.

In the apparatus for supplying and curing a resin according to the invention, a resin is supplied and cured in the following way. First, the resin is supplied in the form of line or multiple dots to specified portions around the clearance of the member to be supplied with the resin, while moving the resin-supply needle. Next, the portions of the aforementioned member where the resin has been supplied are heated by the heating unit. With this treatment, the viscosity of the resin lowers so that the resin can be filled into the clearance in a short time by capillary phenomenon without involving foams. Subsequently, the resin that has been filled in the clearance is cooled by the cooling unit. In consequence of this, the supplying and curing of the resin is carried out in a short time, thus allowing such assemblies as electronic components to be simply fabricated.

When the apparatus comprises moving means for moving the aforementioned member in the vertical or horizontal direction, the member can be moved apart from the heating unit immediately after the resin has been filled into the clearance. Accordingly, the resin having been filled is quickly cooled so that the amount of the resin that overflows the clearance can be controlled.

When the heating unit has a built-in heater and a heating stage that allows the aforementioned member to be placed on its top, the resin that has been filled around the clearance can be simply heated by placing the member on the heating stage. With this treatment, the viscosity of the resin lowers so that the resin can be filled up into the clearance in a short time by capillary phenomenon without involving foams.

When the heating unit comprises the light source for emitting infrared rays, and the slit member for allowing the infrared rays to pass therethrough toward the portions of the member where the resin has been supplied, the resin having been supplied around the clearance can be simply heated by irradiating infrared rays to the resin through the slit member. With this treatment, the viscosity of the resin lowers so that the resin can be filled up into the clearance in a short time by capillary phenomenon without involving foams.

When the heating unit comprises the light source for emitting infrared rays, and the optical fiber for leading the infrared rays toward the portions of the member where the resin has been supplied, the resin having been supplied around the clearance can be simply heated by irradiating infrared rays to the resin from the end of the optical fiber. With this treatment, the viscosity of the resin lowers so that the resin can be filled up into the clearance in a short time by capillary phenomenon without involving foams.

When the heating unit is movable along the portions of the aforementioned member where the resin has been supplied, it is possible to locally heat the parts of the resin in the form of line or multiple dots successively by irradiating infrared rays along the portions of the member where the resin has been supplied. Accordingly, it becomes easier to control the heated state of the resin than that is when the whole region is simultaneously heated, thus preventing the resin from flowing out of the clearance at an excessive amount. In consequence, the amount of overflowing resin can be controlled with high accuracy.

When the infrared rays are laser beams, the light intensity can be easily increased by increasing the output of the light source. Accordingly, the resin is heated with high efficiency, enhancing the treatment capacity of the apparatus.

When the apparatus comprises the ultraviolet irradiation unit for irradiating ultraviolet rays at specified timing to the portions of the aforementioned member where the resin has been supplied, the resin can be cured in a short time by irradiating ultraviolet rays to the resin filled in the clearance (assuming that a photosetting resin is filled) with this ultraviolet irradiation unit. As a result, such assemblies as electronic components can be simply fabricated.

When the ultraviolet irradiation unit comprises the light source for emitting ultraviolet rays, and the optical fiber for leading the ultraviolet rays toward the portions of the aforementioned member where the resin has been supplied, the resin can be cured immediately after it has been supplied, by irradiating ultraviolet rays successively to the parts of the resin that has been filled in the clearance. Accordingly, the resin can be prevented from flowing out of the clearance at an excessive amount, so that the amount of overflowing resin can be controlled with even higher accuracy.

There is provided a method of supplying and curing a resin, comprising the steps of: supplying a resin to a specified vicinity of a clearance of a member to be supplied with the resin in the form of line or multiple dots, while moving a needle for use of supplying a resin; irradiating infrared rays along the portions of the member where the resin has been supplied in the form of line or multiple dots to locally heat successively the resin to thereby lower viscosity of the resin, filling the resin into the clearance by capillary phenomenon; and cooling the resin that has been filled into the clearance.

Also, there is provided a method of supplying and curing a resin, comprising the steps of: supplying a photo-setting resin to a specified vicinity of a clearance of a member to be supplied with the resin, in the form of line or multiple dots, while moving a needle for use of supplying a resin; irradiating infrared rays along the portions of the member where the resin has been supplied in the form of line or multiple dots to locally heat successively the resin to thereby soften the resin, filling the resin into the clearance by capillary phenomenon; and irradiating ultraviolet rays successively to parts of the resin that has been filled, thereby curing the resin immediately after it has been filled.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2A is a sectional view showing the assembly structure of a liquid crystal display device of a second embodiment of the present invention;

DETAILED DESCRIPTION OF THE PREFERRED EMBODIMENTS

The assembly structure and assembling method of a flat type display device and the apparatus and method for supplying and curing a resin therefor according to the present invention are now described in more detail with reference to their embodiments.

Figure 1A:
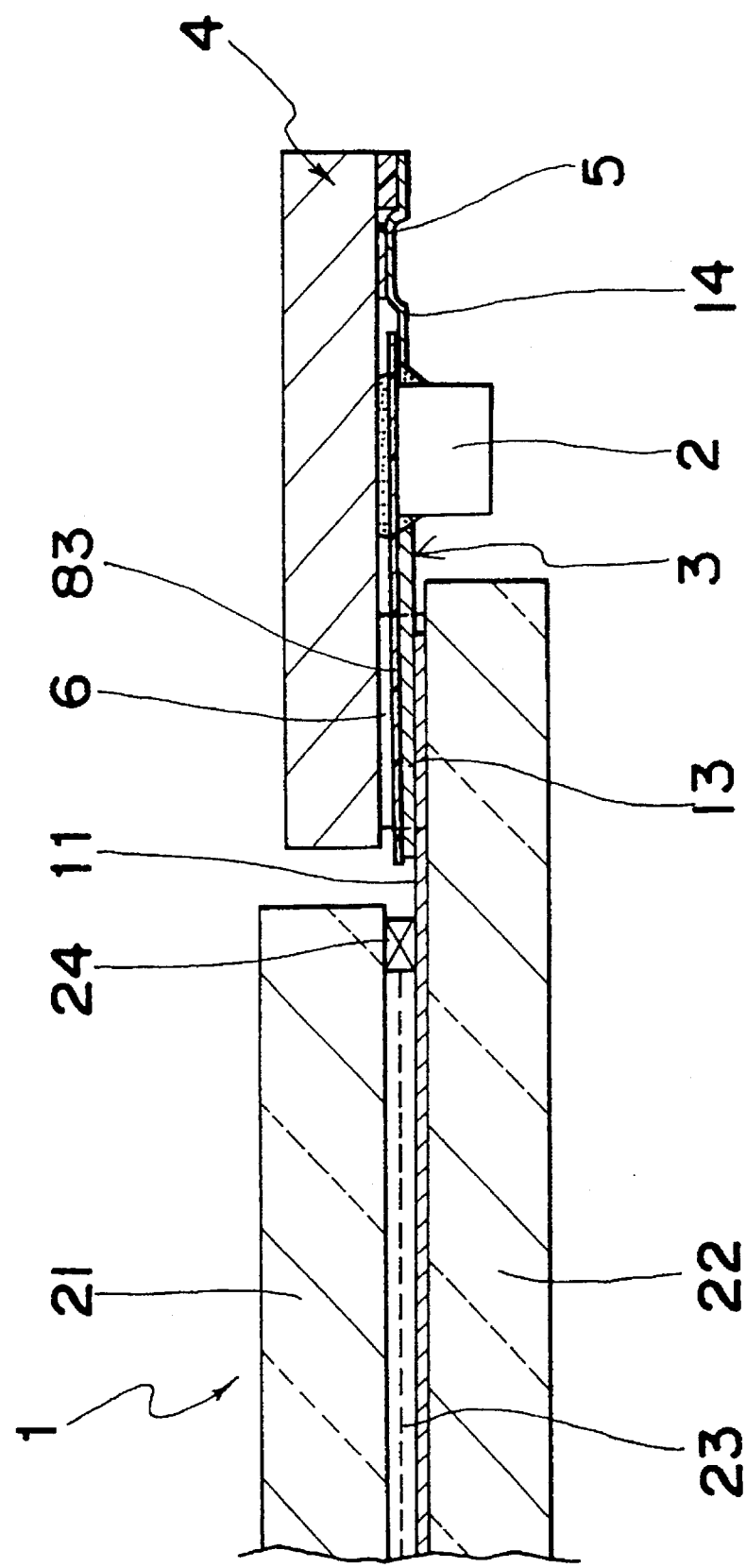
FIG. 1A is a sectional view showing the assembly structure of a liquid crystal display device of a first embodiment of the present invention.
Figure 1B:
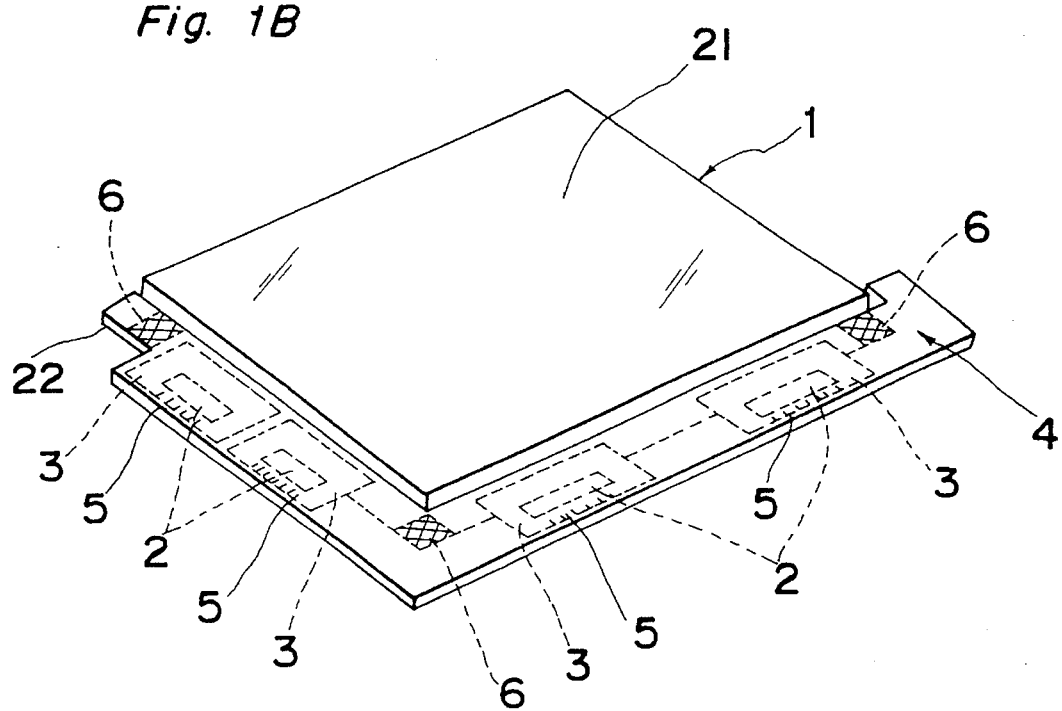
FIG. 1B is a plan view of the liquid crystal display device of the first embodiment.
Figure 14:
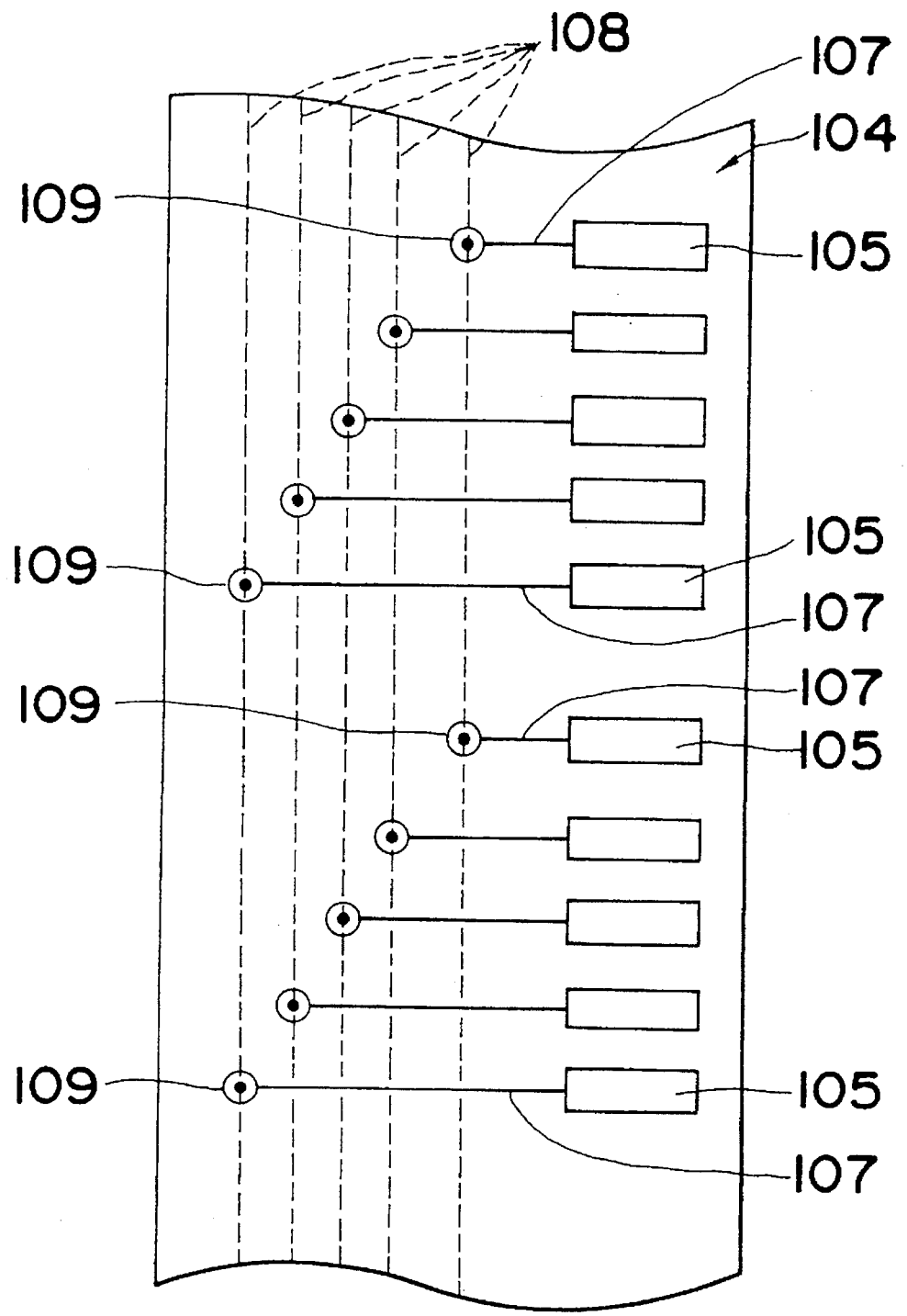
FIG. 14 is a view showing a pattern layout of a common wiring board.
Figure 15:
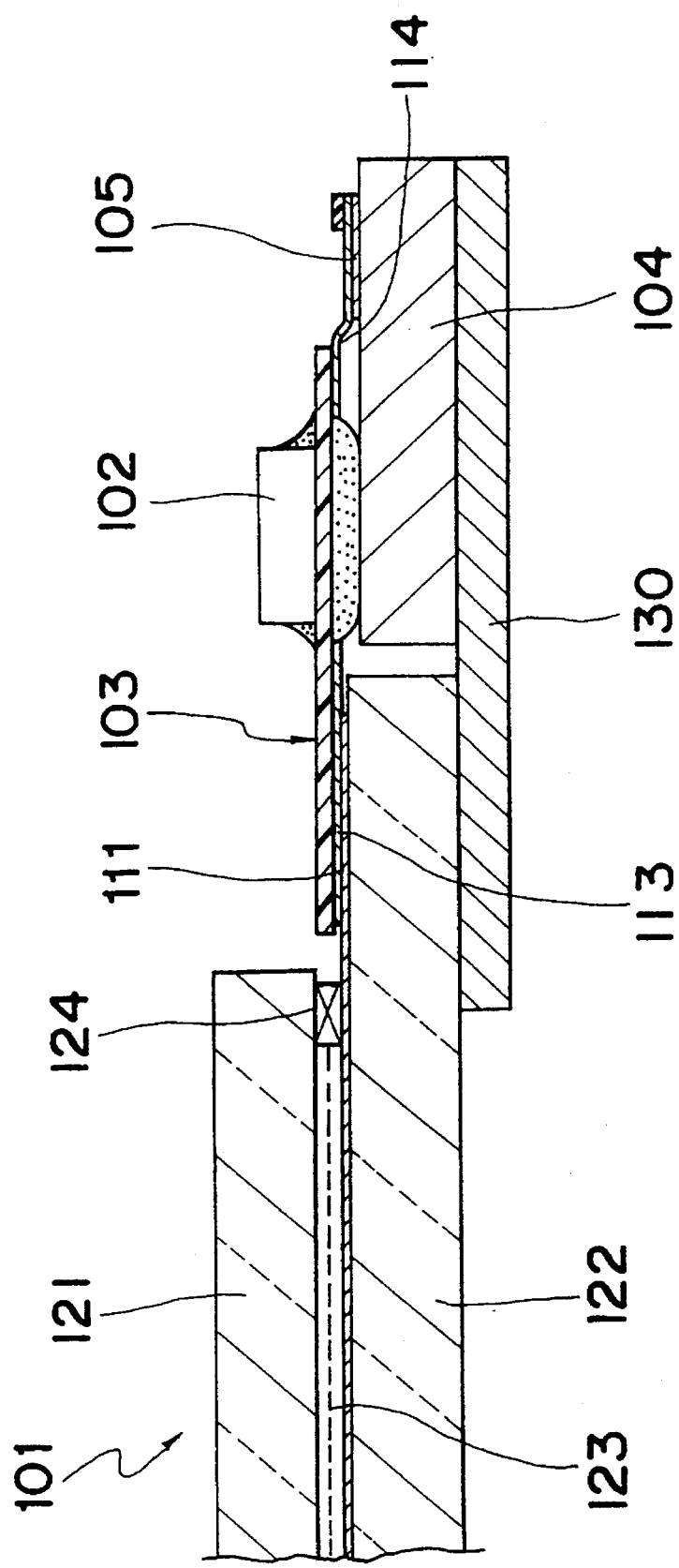
FIG. 15 is a view showing the assembly structure of a conventional liquid crystal display device.
Figure 16:
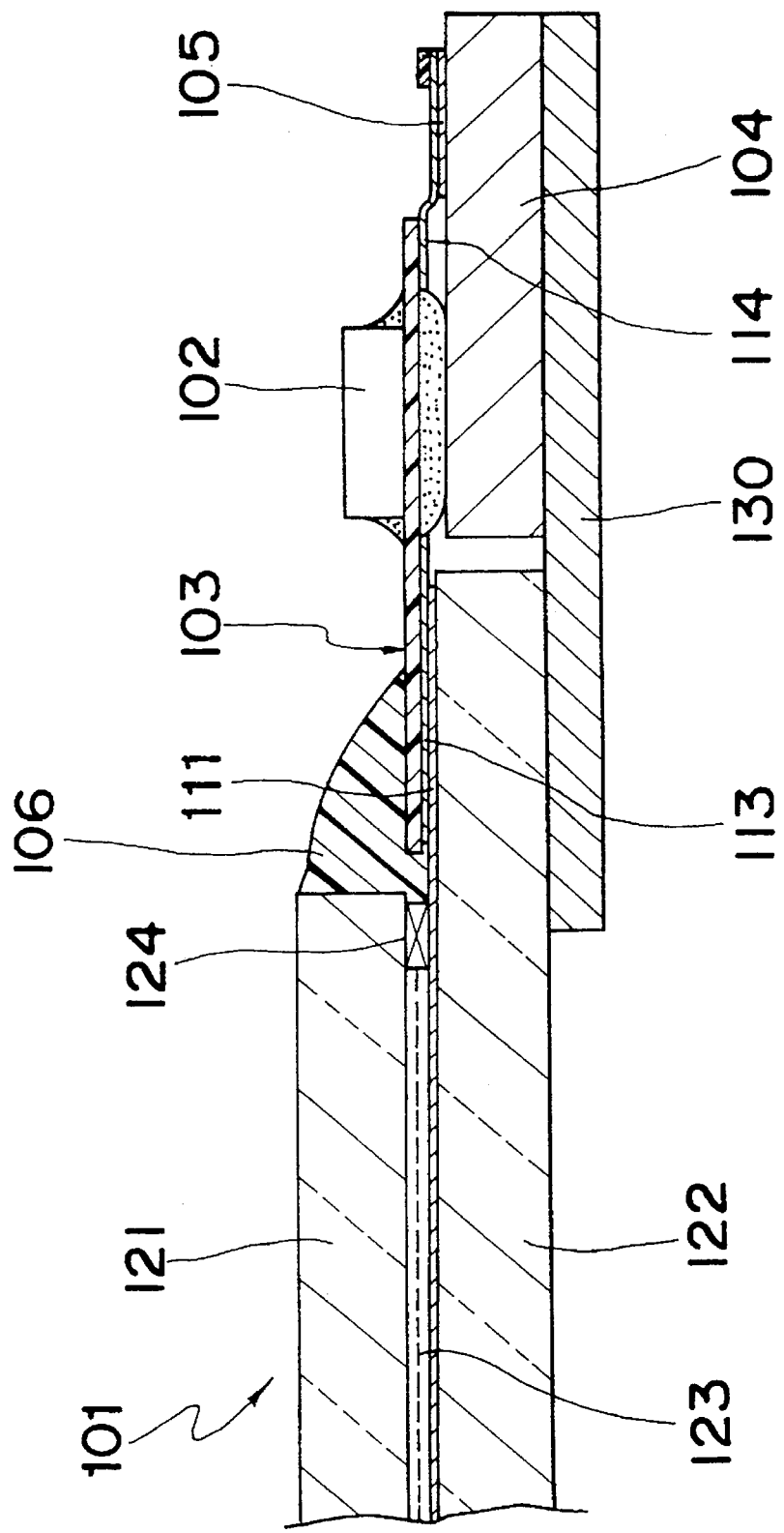
FIG. 16 is a view showing the assembly structure of a conventional liquid crystal display device.

FIGS. 1A and 1B show the assembly structure of a liquid crystal display device of the first embodiment according to the present invention, FIG. 1A is a cross section of its peripheral portion, and FIG. 1B is taken as the whole is viewed diagonally from top. As shown in FIG. 1A, a liquid crystal panel 1 is so constructed that liquid crystals 23 are sealed by a seal 24 between a pair of glass substrates 21 and 22, and that a large number of electrode terminals 11 are disposed on the periphery of one glass substrate 22. A flexible wiring board 3 has a drive IC 2, which serves to drive the liquid crystal panel 1, mounted on a surface of its flexible base member 83. The drive IC 2 and wiring 13 are provided on the same plane. A common wiring board 4 is identical to the conventional one shown in FIG. 14, having electrode terminals 5 on its one side and wiring (not shown) for transmitting an input signal, which has been received by the electrode terminals 5 from external of the common wiring board 4, to the drive IC 2.

The liquid crystal panel 1 and the common wiring board 4 are mounted on each other so as to overlap each other in a state that their surfaces on which their respective electrode terminals 11 and 5 are provided are positioned inside and moreover the electrode terminals 5 of the common wiring board 4 are located outside of the peripheral portion of the liquid crystal panel 1. Further, the flexible wiring board 3 is provided in the clearance between the liquid crystal panel 1 and the common wiring board 4. The drive IC 2 is secured to a surface of the flexible wiring board 3 opposite to a surface of the flexible wiring board 3 where the common wiring board 4 is mounted, in the state that the IC 2 is located outside of the peripheral portion of the liquid crystal panel 1.

In assembling, first, the electrode terminals 11 of the liquid crystal panel 1 and output terminals 13 of the flexible wiring board 3 are connected by means of an anisotropic conductive film (not shown) or the like, while input terminals 14 of the flexible wiring board 3 and the electrode terminals 5 of the common wiring board 4 are connected by means of solder or the like. In doing this, the drive IC 2 is located on a surface of the flexible wiring board 3 opposite to a surface of the flexible wiring board 3 where the common wiring board 4 is mounted. Next, an end portion of the common wiring board 4 opposite to an end portion of the common wiring board 4 where the electrode terminals 5 is provided is overlapped on the peripheral portion of the glass substrate 22 and as such fixed by means of a fixative 6 such as an adhesive or double-faced tape. As a result, the flexible wiring board 3 is sandwiched between the glass substrate 22 and the common wiring board 4.

As described above, the liquid crystal panel 1 and the common wiring board 4 are mounted so as to overlap each other; therefore, even if the width of the common wiring board 4 is not below a specified length (approx. 10 mm), the area of the peripheral region of the liquid crystal device can be reduced by their overlapping portion. Accordingly, the liquid crystal panel 1 can be formed compactly. Further, the liquid crystal panel 1 and the common wiring board 4 are mounted on each other in such a way that their surfaces on which their respective electrode terminals 11 and 5 are provided are positioned inside and moreover the electrode terminals 5 of the common wiring board 4 are located outside of the peripheral portion of the liquid crystal panel 1; therefore, the electrode terminals 11 of the liquid crystal panel 1 and the electrode terminals 5 of the common wiring board 4 can be connected at minimum distances by the flexible wiring board 3. In consequence, the liquid crystal device can be assembled compactly without the need of drawing the flexible wiring board 3 long around.

The thickness of the drive IC 2 is in general smaller than that of the glass substrate 22. Accordingly, by locating the drive IC 2 just beside the glass substrate 22, the total thickness of the assembled liquid crystal device can be prevented from increasing due to the thickness of the drive IC 2. In consequence, the liquid crystal device can be assembled compactly.

Figure 2B:
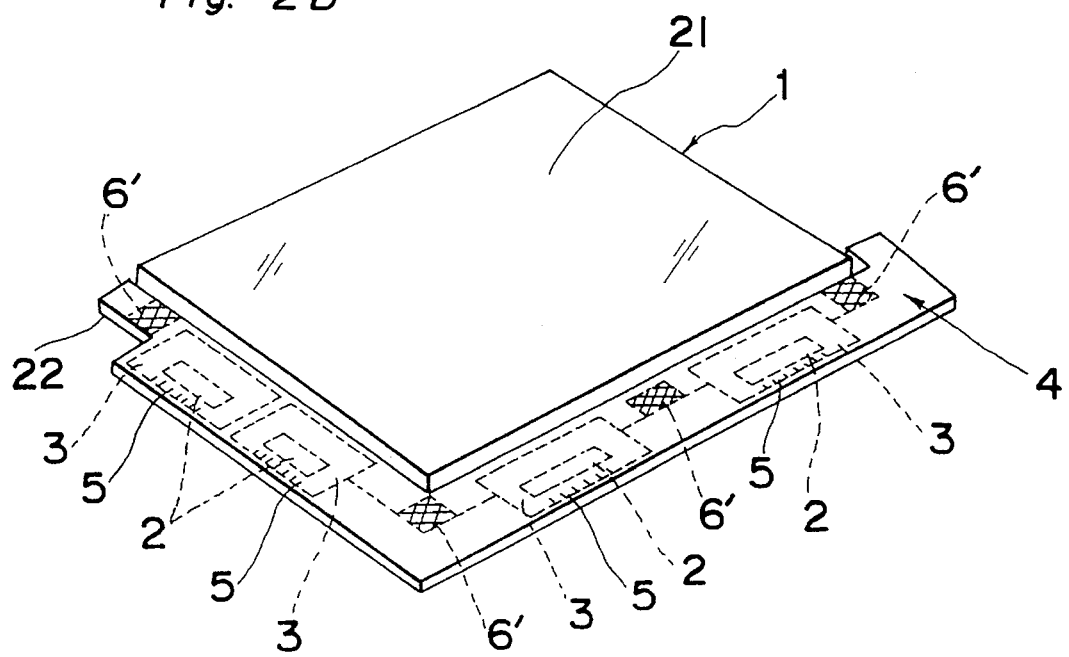
FIG. 2B is a plan view of the liquid crystal display device of the second embodiment.

FIGS. 2A and 2B show the assembly structure of a liquid crystal device of the second embodiment according to the present invention, FIG. 2 is a cross section of its peripheral portion, and FIG. 2B is taken as the whole is viewed diagonally from top, where like parts are designated by like numerals in connection with FIGS. 1A and 1B. As shown in FIG. 2A, a liquid crystal panel 1 is so constructed that liquid crystals 23 are sealed by a seal 24 between a pair of glass substrates 21 and 22, and that a large number of electrode terminals 11 are disposed on the periphery of one glass substrate 22. A flexible wiring board 3 has a drive IC 2, which serves for driving the liquid crystal panel 1, mounted on the surface of its flexible base material 83 which is composed of polyimide or polyester or the like. The drive IC 2 and wiring to be connected thereto are provided on the same plane. A common wiring board 4 is identical to the conventional one shown in FIG. 14, having electrode terminals 5 on its one side and wiring (not shown) for transmitting an input signal, which has been received by the electrode terminals 5 from external of the common wiring board 4, to the drive ICs 2.

The liquid crystal panel 1 and the common wiring board 4 overlap on each other in such a way that their surfaces on which their respective electrode terminals 11 and 5 are provided faces each other and moreover the electrode terminals 5 of the common wiring board 4 are located in outer proximity to the peripheral portion of the liquid crystal panel 1. And as such, they are integrally secured by means of an anisotropic conductive material (not shown) as a bonding material and spacers (e.g. made of cylinder-shaped glass) 6'. The liquid crystal panel 1 and the common wiring board 4 are held spaced at an interval nearly equal to the thickness of the flexible wiring board 3, in this case approx. 60 μm, by the thicknesses of the spacer 6' and the anisotropic conductive material. Further, the flexible wiring board 3 is provided in the clearance between the liquid crystal panel 1 and the common wiring board 4. The drive IC 2 is secured to a surface of the flexible wiring board 3 opposite to a surface of the flexible wiring board 3 where the common wiring board 4 is mounted in the state that the drive IC 2 is located outside of the peripheral portion of the liquid crystal panel 1. The liquid crystal panel 1 and the flexible wiring board 3 are connected to each other by means of an anisotropic conductive material, which is not shown.

Figure 5:
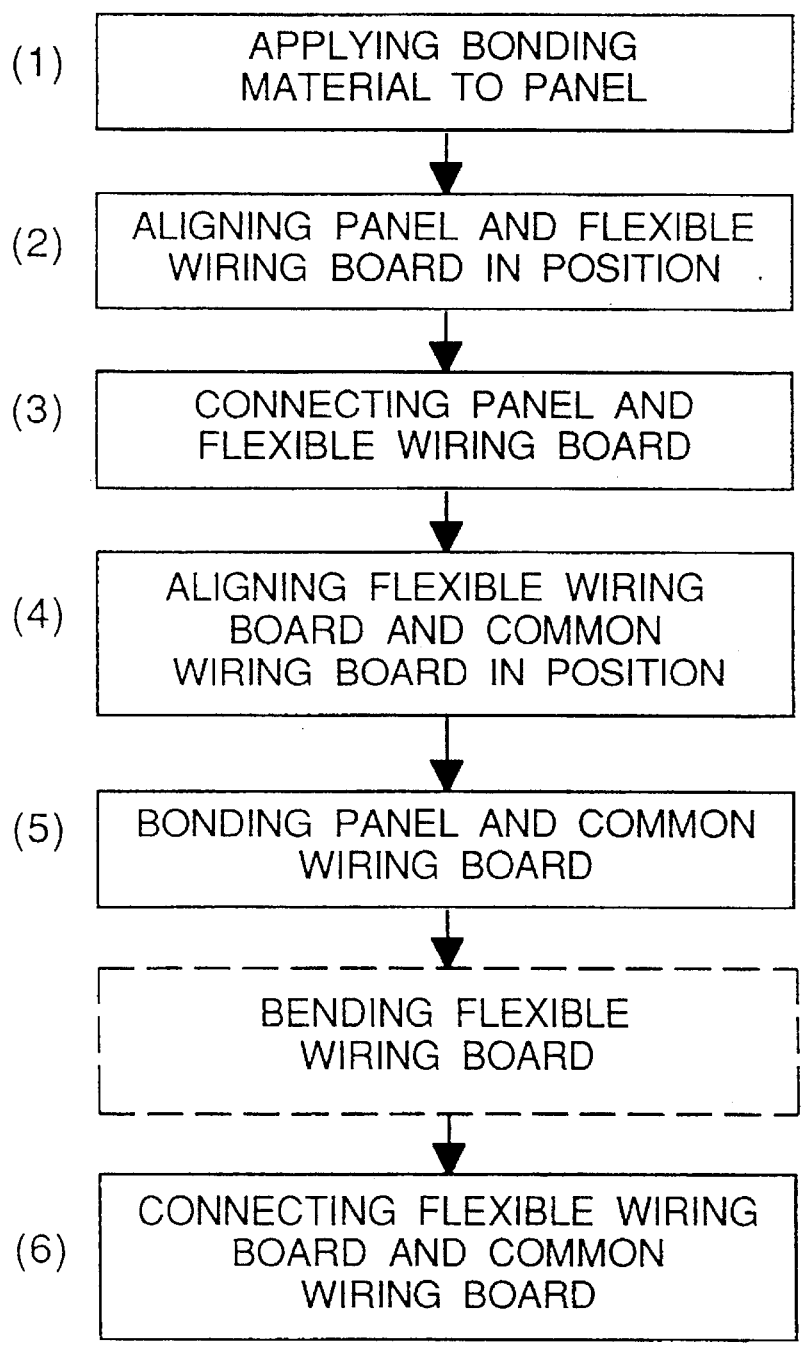
FIG. 5 is a view showing the processing flow for explaining the assembling method of a liquid crystal display device of an embodiment according to the present invention.

The assembling is carried out following the processing flow as shown in FIG. 5.

Figure 6:
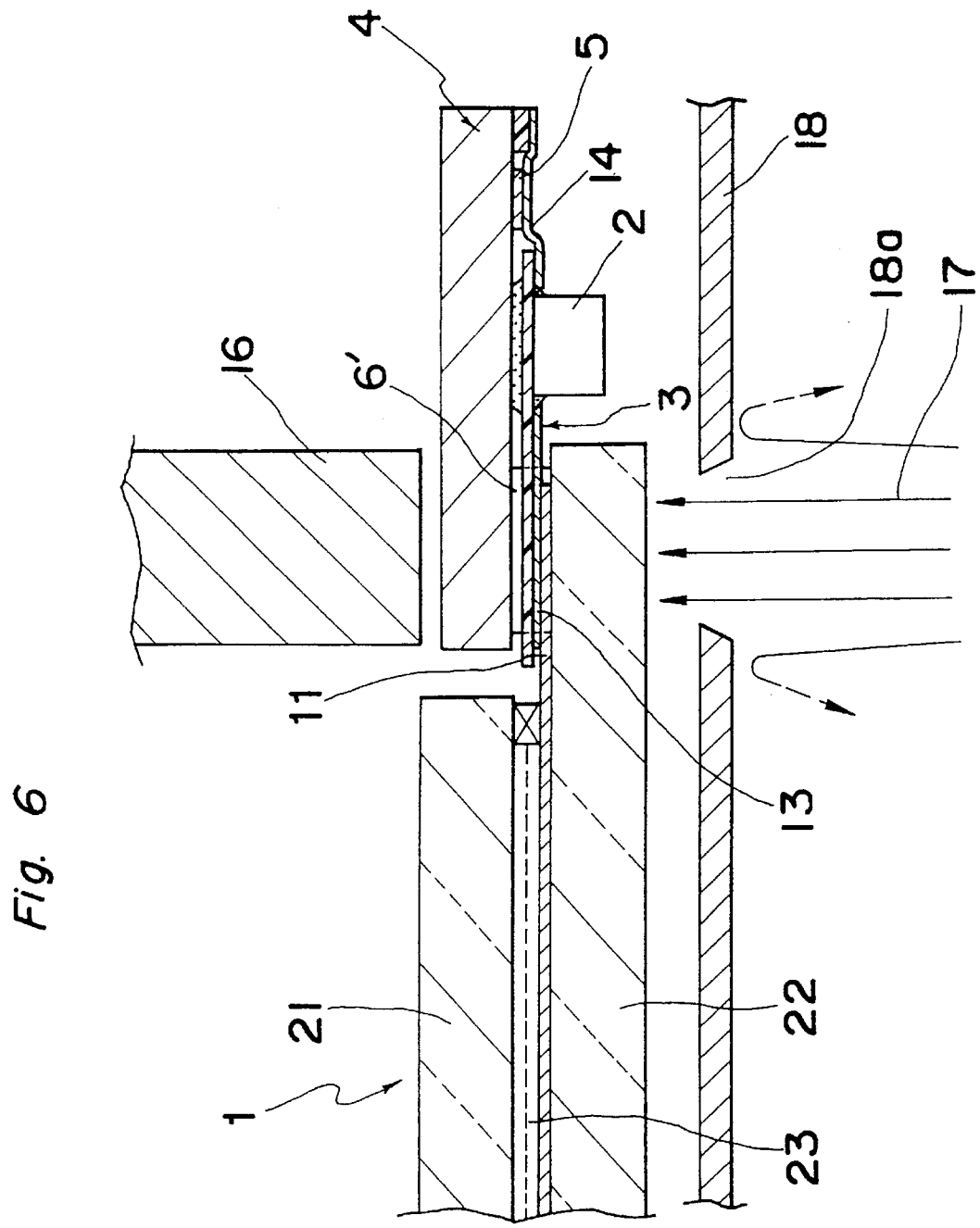
FIG. 6 is a view showing a state in which an anisotropic conductive material is cured by a back-pressure beam type infrared irradiation system.

(1) First, an anisotropic conductive material that will be cured by heat and pressure is made to adhere to a plurality of portions within the face of the liquid crystal panel 1 on the electrode terminals 11 side as shown in FIGS. 2A and 2B;

(2) Next, the flexible wiring board 3 is aligned in position with the aforementioned face of the liquid crystal panel 1. In this state, the liquid crystal panel 1 and the flexible wiring board 3 are temporarily fixed by jigs or others;

(3) Then, each part of the anisotropic conductive material that exists in the region at which the liquid crystal panel 1 and the flexible wiring board 3 overlap each other is locally heated and pressurized to thereby cure it, by using a bonding device of the back-pressure beam type infrared irradiation system, as shown in FIG. 6. In more detail, with the common wiring board 4 side being as a back face and a pressure tool 16 urged against the common wiring board 4, infrared rays 17 are irradiated to the connecting points through a slit 18a of a mask 18. By so doing, the electrode terminals 11 of the liquid crystal panel 1 and the output terminals 13 of the flexible wiring board 3 are connected to each other. It is noted that whereas FIG. 6 shows a state in which the connected terminals 11 and 13 are connected under pressure via the common wiring board 4, FIG. 5 shows a step in which the common wiring board 4 is still kept from being supplied and the pressure tool 16 is thrown into contact with the flexible wiring board 3. In addition, a glass substrate may be inserted between the liquid crystal panel 1 and the mask 18 to protect the liquid crystal panel 1. The material of the pressure tool 16 may be in a wide range of hardness from as low as rubber, to as high as metal. Alternatively, in place of the pressure tool 16, a film such as balloon-like polyimide applied a high pressure may be thrown into such contact;

(4) Then, the liquid crystal panel 1 and the common wiring board 4, the latter being previously provided with the spacers 6', are overlapped on each other in such a way that their faces on which their respective electrode terminals 11 and 5 are provided are opposed to each other and that the electrode terminals 5 of the common wiring board 4 are located outside of the peripheral portion of the liquid crystal panel 1. In this state, the flexible wiring board 3 and the common wiring board 4 are aligned into position. In this aligned state, the liquid crystal panel 1 and the common wiring board 4 are temporarily fixed by means of jigs or others;

(5) Then, each part of the anisotropic conductive material that exists in the region at which the liquid crystal panel 1 and the common wiring board 4 are directly faced to each other without the intervention of the flexible wiring board 3 is locally heated and pressurized to thereby cure it, by using a bonding device of the back-pressure beam type infrared irradiation system, in the same way as shown in FIG. 6. Using the bonding device of the back-pressure beam type infrared irradiation system allows the curing to be accomplished with almost no thermal stress applied to the connecting points between the liquid crystal panel 1, and the flexible wiring board 3 which are already cured. This contributes to enhancing the reliability of the connecting points between the liquid crystal panel 1 and the flexible wiring board 3, especially when the anisotropic conductive material is thermoplastic. In contrast, when the anisotropic conductive material is thermosetting, connection by the pulse tool system may be adopted instead. In this way, the liquid crystal panel 1 and the common wiring board 4 are integrally secured; and (6) Then, the input terminals 14 of the flexible wiring board 3 and the electrode terminals 5 of the common wiring board 4 are connected to each other by means of solder or the like. The flexible wiring board 3 is, as a result, sandwiched between the glass substrate 22 and the common wiring board 4.

As described above, the liquid crystal panel 1 and the common wiring board 4 are mounted so as to overlap each other; therefore, even if the width of the common wiring board 4 is not below a specified length (approx. 10 mm), the area of the peripheral region of the liquid crystal device can be satisfactory reduced by their overlapping portion. Further, the liquid crystal panel 1 and the common wiring board 4 are integrally secured by means of the anisotropic conductive material; therefore, it is not necessary to provide a thick frame or the like, which allows the module to be reduced in thickness accordingly. In consequence, the liquid crystal device can be assembled compactly. It is noted that, since the liquid crystal panel 1 and the common wiring board 4 are arranged in such a way that their faces on which their respective electrode terminals 11 and 5 are provided face each other and that the electrode terminals 5 of the common wiring board 4 are located outside of the peripheral portion of the liquid crystal panel 1, the electrode terminals 11 of the liquid crystal panel 1 and the electrode terminals 5 of the common wiring board 4 can be connected at minimum distances by the flexible wiring board 3. Consequently, the liquid crystal device can be assembled compactly without the need of drawing the flexible wiring board 3 long around.

Further, the thickness of the drive IC 2 is generally smaller than that of the glass substrate 22. Accordingly, by locating the drive IC 2 just beside the glass substrate 22 the assembly's total thickness can be prevented from increasing due to the thickness of the drive IC 2. In consequence, the liquid crystal device can be assembled compactly.

Furthermore, since the liquid crystal panel 1 and the common wiring board 4 are integrally secured by the spacer 6' and the anisotropic conductive material, the strength of the module and therefore its reliability are enhanced and besides any excessive members such as a frame may be omitted. In consequence, the material cost and manpower required can be reduced accordingly, allowing the liquid crystal panel 1 to be assembled with low cost.

Figure 4:
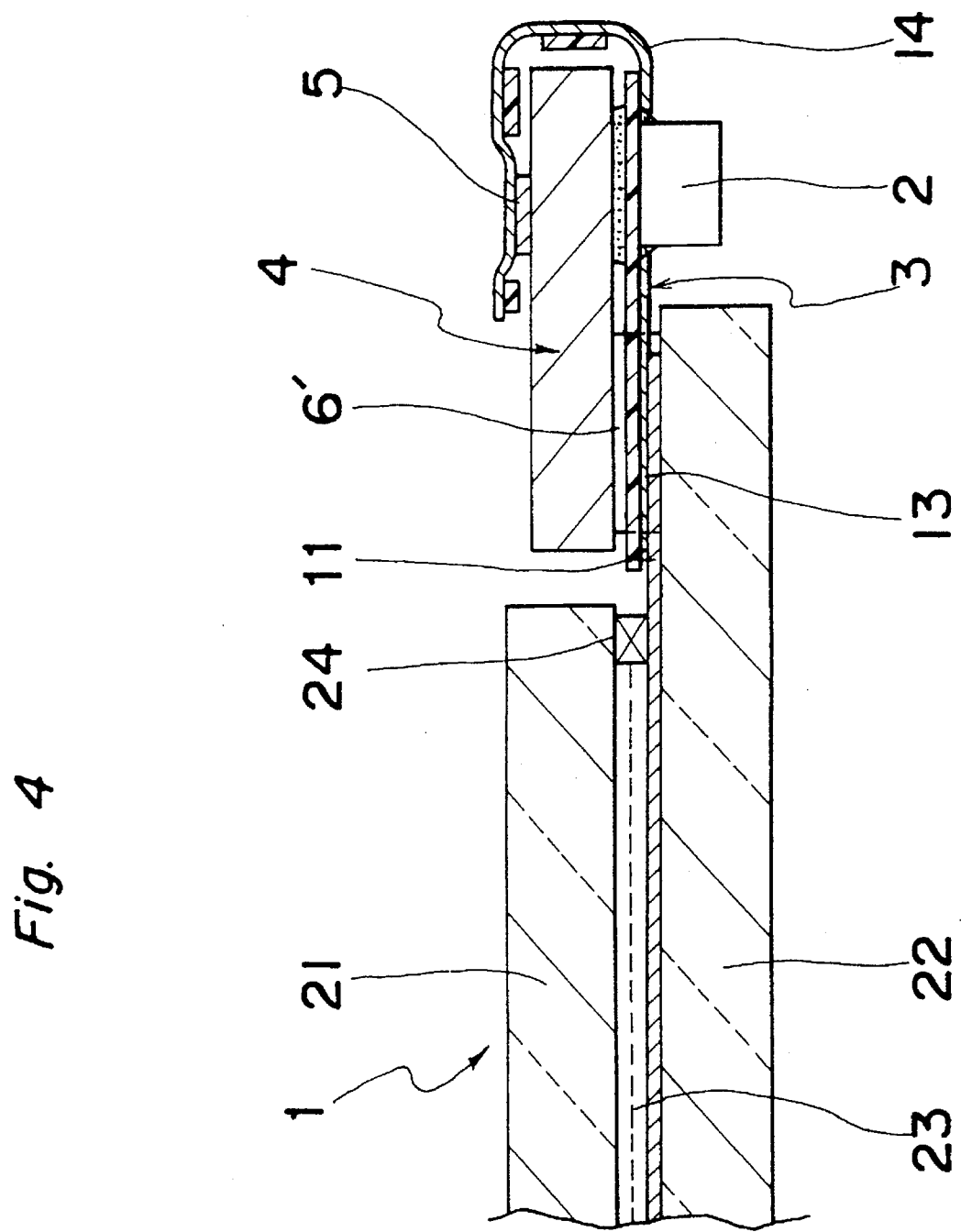
FIG. 4 is a sectional view showing the assembly structure of a liquid crystal display device of a fourth embodiment according to the present invention.

In addition, it may be arranged alternatively that electrode terminals 5 is provided on a face of a common wiring board 4 opposite to a face of the common wiring board 4 facing the liquid crystal panel 1, as shown in FIG. 4, in the step (4), and that, after the aforementioned step (5), an input terminal leading part 14 of a flexible wiring board 3 is bent and wound along the peripheral portion of the common wiring board 4. Thereafter, in the step (6), the input terminals 14 of the flexible wiring board 3 are connected to electrode terminals 5 of the common wiring board 4. When this arrangement is made, the width of the common wiring board 4 can be reduced to the extent of the electrode terminals 5. Accordingly, the area of the peripheral region of the liquid crystal panel 1 can be further reduced. As a result of this, the size of the casing to be attached to the periphery of the liquid crystal panel 1 can be reduced. Moreover, if the connecting points between the flexible wiring board 3 and the common wiring board 4 will not peel against the effect of the heating that is carried out to connect the common wiring board 4 and the liquid crystal panel 1, it is also possible that first the flexible wiring board 3 and the common wiring board 4 are connected to each other as the flexible wiring board 3 is in its flat state, and then, by bending the flexible wiring board 3, the common wiring board 4 is connected to the liquid crystal panel 1, followed by bonding and fixing together.

In the case of FIGS. 2A and 2B, an anisotropic conductive material has been adopted as the bonding material, but of course it is not limited to this. Instead of the anisotropic conductive material, solder or a resin which will be cured by light irradiation may be used.

The spacers 6' is comprised, for example, of a spherical or cylindrical glass material or plastic beads. However, when solder is used as the bonding material, copper beads or like materials which are wetted with solder are preferable. Also, the spacers 6' may be a printed paste; in this case, the spacers 6' can be easily provided before starting the assembling process. However, when solder is used as the bonding material, a solder-wetting conductive paste should be used. The pattern of the spacers 6' may be either rectangular (see FIG. 2B) or multiple dots, which is preferable in terms of the fluidity of the anisotropic conductive material during the curing process.

When the substrate that forms the common wiring board 4 has flexibility, the common wiring board 4 may be bent at a portion where the flexible wiring board 3 do not exist so as to be close to the liquid crystal panel 1 even if the spacers 6' are not provided. Accordingly, the liquid crystal panel 1 and the common wiring board 4 can be integrally secured by means of the bonding material without being obstructed by the thickness of the flexible wiring board 3.

When the flexible wiring board 3 is double-layer structured of a base material and a wiring material, the flexible wiring board 3 can be reduced in thickness, compared to the case where a protective layer is provided on the wiring material. Accordingly, the thickness of the module can be further reduced.

Figure 3:
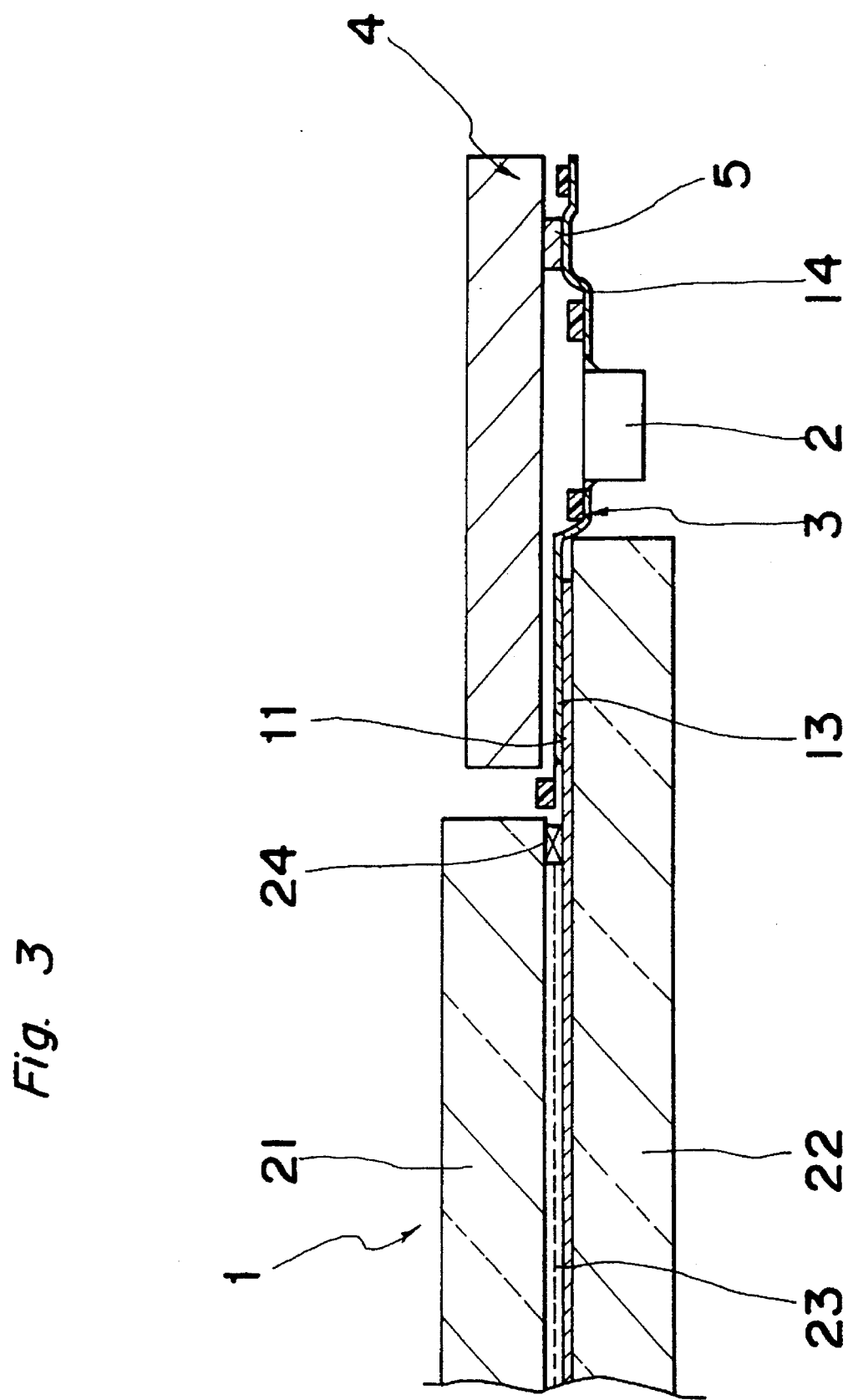
FIG. 3 is a sectional view showing the assembly structure of a liquid crystal display device of a third embodiment according to the present invention.

Also, as shown in FIG. 3, a portion 13 of a flexible wiring board 3, provided in the clearance between the liquid crystal panel 1 and the common wiring board 4, may be comprised of the aforementioned wiring material only. In more detail, before starting the assembling, the base material formed of polyimide is previously removed by etching. In this case, the thickness of the module can be further reduced by the thickness of the base material. Yet, when the thickness of the wiring material (e.g. 12 μm) is smaller than that of the anisotropic conductive material (e.g. 20 μm), the spacers 6' may be omitted so that the thickness of the module can be further reduced.

Moreover, when reliabilities are rigorously required, for example, to meet specifications for vehicle parts, a silicone resin or the like for use of reinforcement may be applied to the input and output terminals 13 and 14 of the flexible wiring board 3 or the peripheral portion of the glass substrate 22 of the liquid crystal panel 1. For general specifications, however, such reinforcement is not necessitated because the liquid crystal panel 1 and the common wiring board 4 are integrated.

Figure 7A:
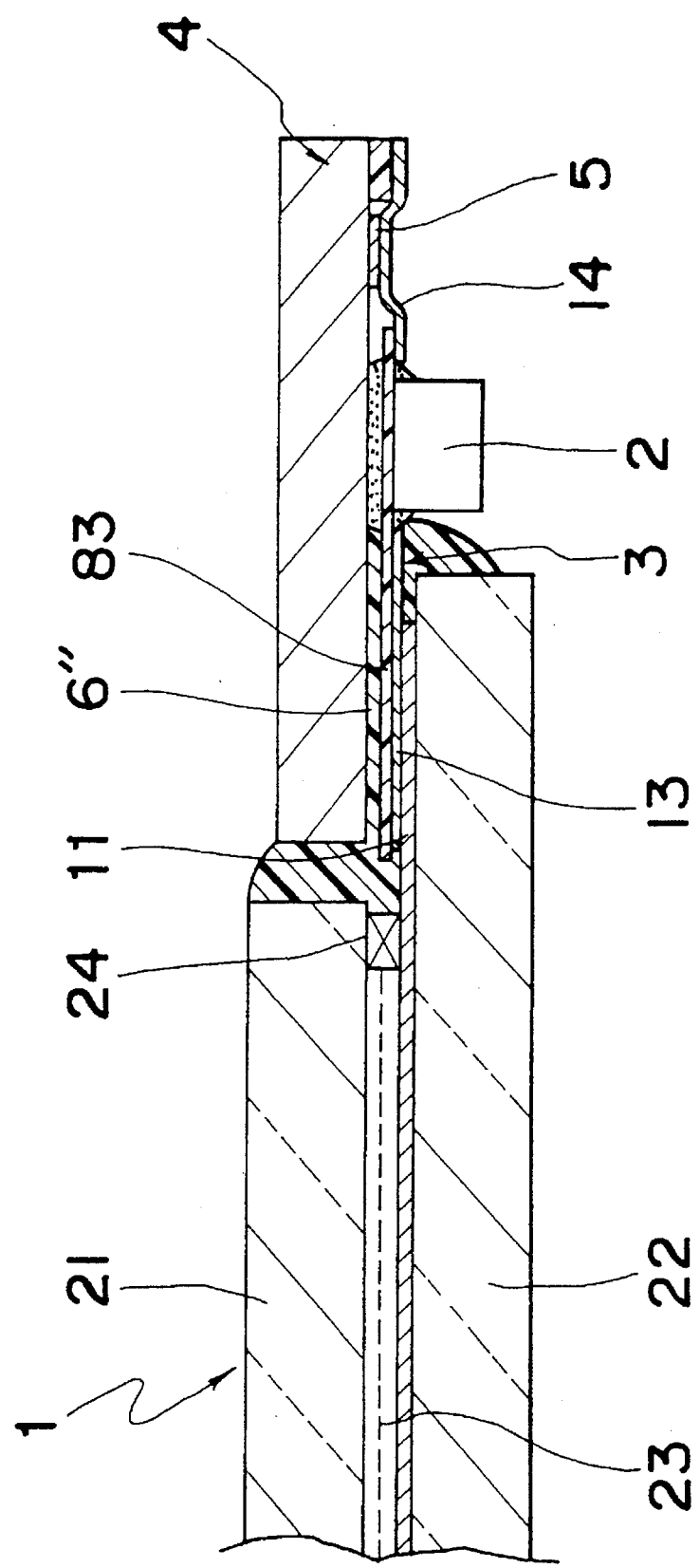
FIG. 7A is a view showing the assembly structure of a liquid crystal display device of a fifth embodiment according to the present invention.
Figure 7B:
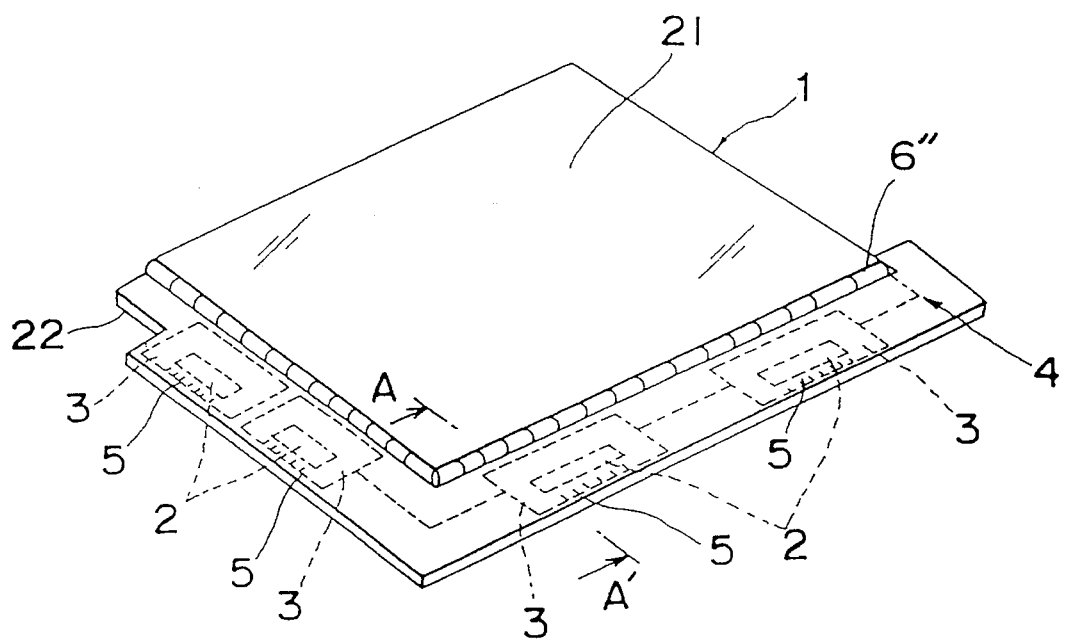
FIG. 7B is a plan view of the liquid crystal display device of the fifth embodiment.

FIGS. 7A and 7B shows the assembly structure of a liquid crystal device of the third embodiment according to the present invention, FIG. 7B is taken as the whole is viewed diagonally from top; and FIG. 7A is a cross section taken along the line 7A—7A in FIG. 7B as viewed in the arrow direction, where like parts are designated by like numerals in connection with FIGS. 1A, 1B, 2A and 2B. As shown in FIG. 7A, the liquid crystal panel 1 is so constructed that liquid crystals 23 are sealed by a seal 24 between a pair of glass substrates 21 and 22 and that a large number of electrode terminals 11 are disposed on the periphery of one glass substrate 22. The flexible wiring board 3 has a drive IC 2, which serves for driving the liquid crystal panel 1, mounted on the surface of its flexible base material 83. It is noted that the drive IC 2 and wiring 13 are provided on the same plane. The common wiring board 4 has electrode terminals 5 on its one face and wiring for transmitting an input signal, which has been received by the electrode terminals 5 from external of the common wiring board 4, to the drive IC 2.

The liquid crystal panel 1 and the common wiring board 4 are mounted so as to overlap each other in such a way that their faces on which their respective electrode terminals 11 and 5 are provided are opposed to each other and that the electrode terminals 5 of the common wiring board 4 are located outside of the peripheral portion of the liquid crystal panel 1. The flexible wiring board 3 is provided in the clearance between the liquid crystal panel 1 and the common wiring board 4. The drive IC 2 is secured to a surface of the flexible wiring board 3 opposite to a surface of the flexible wiring board 3 where the common wiring board 4 is mounted, in such a way that the IC 2 is located outside of the peripheral portion of the liquid crystal panel 1. Further, in the clearance between the liquid crystal panel 1 and the common wiring board 4, more specifically both between an end face of the glass substrate 21 and an end face of the common wiring board 4 and between the peripheral portion of the glass substrate 22 and a face of the common wiring board 4, there is filled and applied, for example, an epoxy-based protective resin 6". The protective resin 6" integrates the liquid crystal panel 1, the flexible wiring board 3, and the common wiring board 4, and besides protects the connecting portions 11 and 13 between the flexible wiring board 3 and the liquid crystal panel 1.

The above-described liquid crystal device is assembled in the following way.

(1) First, the electrode terminals 11 of the liquid crystal panel 1 and the output terminals 13 of the flexible wiring board 3 are aligned in position, and connected to each other by means of solder, an anisotropic conductive film or the like;

(2) Meanwhile, either one of the liquid crystal panel 1 or the common wiring board 4 or both of them are coated with the epoxy-based protective resin 6" by screen printing, offset printing, band coating with a nozzle, or the like. Although the resin 6" may be the thermosetting type, anaerobic setting type, or any other setting type that allows the setting to be accomplished by being left at room temperature, yet it is preferably photo-setting type by virtue of its quick drying characteristic which allows the necessary manpower to be reduced;

(3) Next, the liquid crystal panel 1 (or the flexible wiring board 3) and the common wiring board 4 are aligned, in which state the epoxy resin 6" is cured by a curing oven, irradiation oven, leaving at room temperature, $N_2$ oven, or the like. It is noted that the resin 6" may also be temporarily heated to reduce its viscosity before curing (followed by cooling). Thus, the resin 6" is flowed in a short time, preventing it from excessively overflowing; and (4) Finally, the input terminals 14 of the flexible wiring board 3 and the electrode terminals 5 of the common wiring board 4 are connected by solder or an anisotropic conductive material, or the like. In doing this, the drive IC 2 is positioned on a surface of the flexible wiring board 3 opposite to a surface of the flexible wiring board 3 where the common wiring board 4 is mounted. The flexible wiring board 3 is sandwiched between the glass substrate 22 and the common wiring board 4.

In addition, before applying the resin 6" in the step (2), faulty IC 2 may be changed, if any, by implementing a display test of the panel. Also, the connection between the input terminals 14 of the flexible wiring board 3 and the electrode terminals 5 of the common wiring board 4, which has been implemented at the step (4) in the above case, may alternatively be done before the curing of the resin 6" in the step (3).

As described above, the liquid crystal panel 1 and the common wiring board 4 are mounted so as to overlap each other; therefore, even if the width of the common wiring board 4 is not below a specified length (approx. 10 mm), the area of the peripheral region can be satisfactorily reduced by their overlapping portion. Accordingly, the liquid crystal device can be assembled compactly. Further, the liquid crystal panel 1, the flexible wiring board 3, and the common wiring board 4 are integrally fixed with the resin 6", eliminating the need of providing a thick frame. The thickness of the module can be reduced accordingly. As a result, the liquid crystal device can be assembled thin and compactly. In addition, the liquid crystal panel 1 and the common wiring board 4 are such that their faces on which their respective electrode terminals 11 and 5 are provided are opposed to each other and that the electrode terminals 5 of the common wiring board 4 are located outside of the peripheral portion of the liquid crystal panel 1; therefore, the electrode terminals 11 of the liquid crystal panel 1 and the electrode terminals 5 of the common wiring board 4 can be connected at minimum distances by the flexible wiring board 3. In consequence, the liquid crystal panel 1 can be assembled compactly without the need of drawing the flexible wiring board 3 long around.

The thickness of the drive IC 2 is generally smaller than that of the glass substrate 22. Accordingly, by locating the drive IC 2 just beside the glass substrate 22, the assembly's total thickness can be prevented from increasing due to the thickness of the drive IC 2. In consequence, the liquid crystal device can be assembled further thin and compactly.

Since the liquid crystal panel 1, the flexible wiring board 3, and the common wiring board 4 are integrally fixed with the resin 6", the strength of the module and therefore its reliability can be enhanced and besides any excessive members may be omitted. As a result, the material cost and manpower required can be reduced accordingly, allowing the liquid crystal panel 1 to be mounted with low cost.

In addition, the protective resin has been conventionally provided by use of silicone base resin to prevent the effect of shrinkage stress to the connecting points between the liquid crystal panel and the flexible wiring board. However, in the structure of the invention, the common wiring board 4 does not protrude so much out of the panel 1, and moreover the liquid crystal panel 1, the flexible wiring board 3, and the common wiring board 4 are integrated together. Thus, the stress to the aforementioned connecting points is reduced. Also, it is into the clearance between the liquid crystal panel 1 and the common wiring board 4 that the protective resin 6" is injected, so that a less amount of the resin will overflow. Accordingly, the total amount of the resin used can be lessened. As a result, the shrinkage force involved in the curing of the protective resin 6" and the stress resulting from any temperature change due to differences in thermal expansion coefficient among the members involved can be suppressed smaller. This allows use of an epoxy resin 6" which is superior in rigidity to silicone resins, and moreover helps strengthen the module and thereby enhance its reliability.

Figure 8:
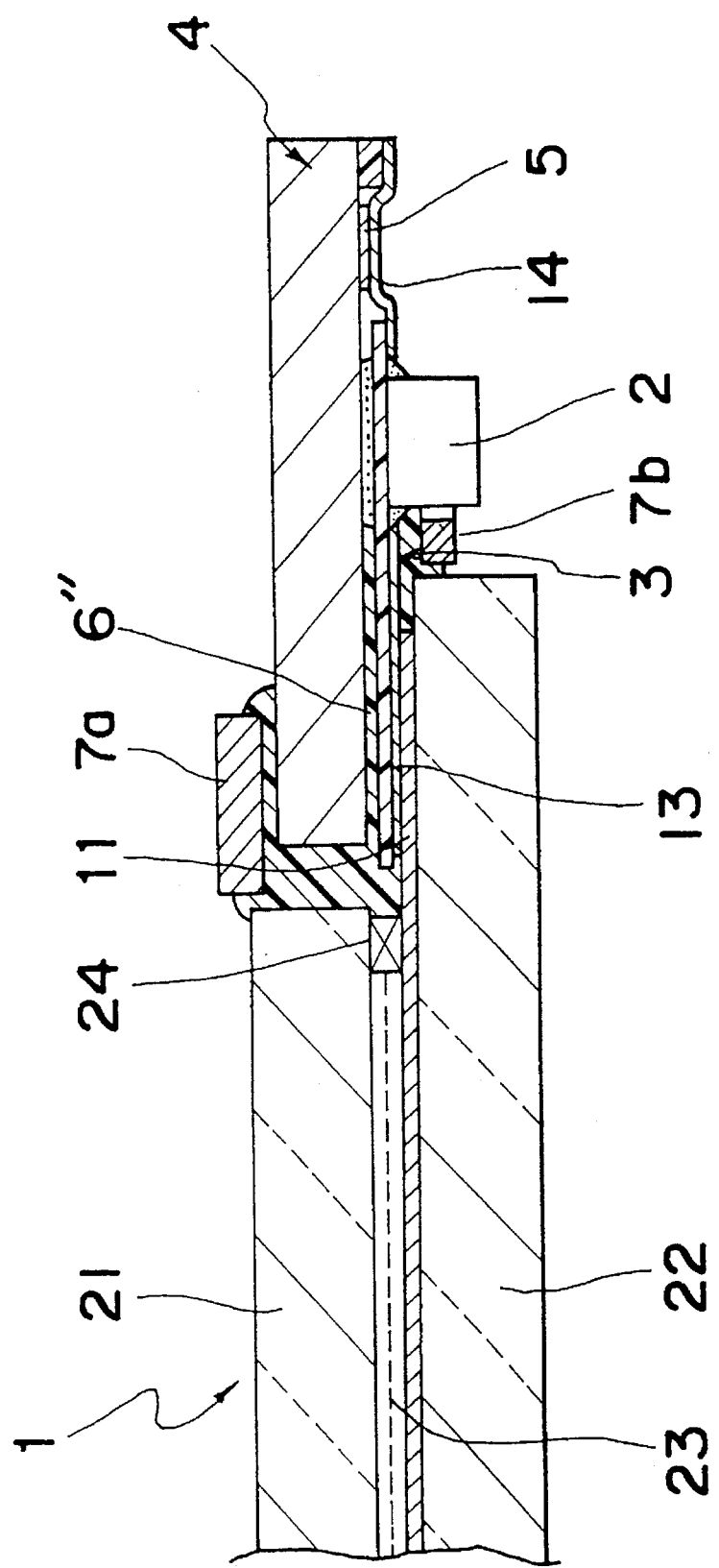
FIG. 8 is a sectional view showing a variant of the assembly structure of the aforementioned liquid crystal display device.
Figure 9:
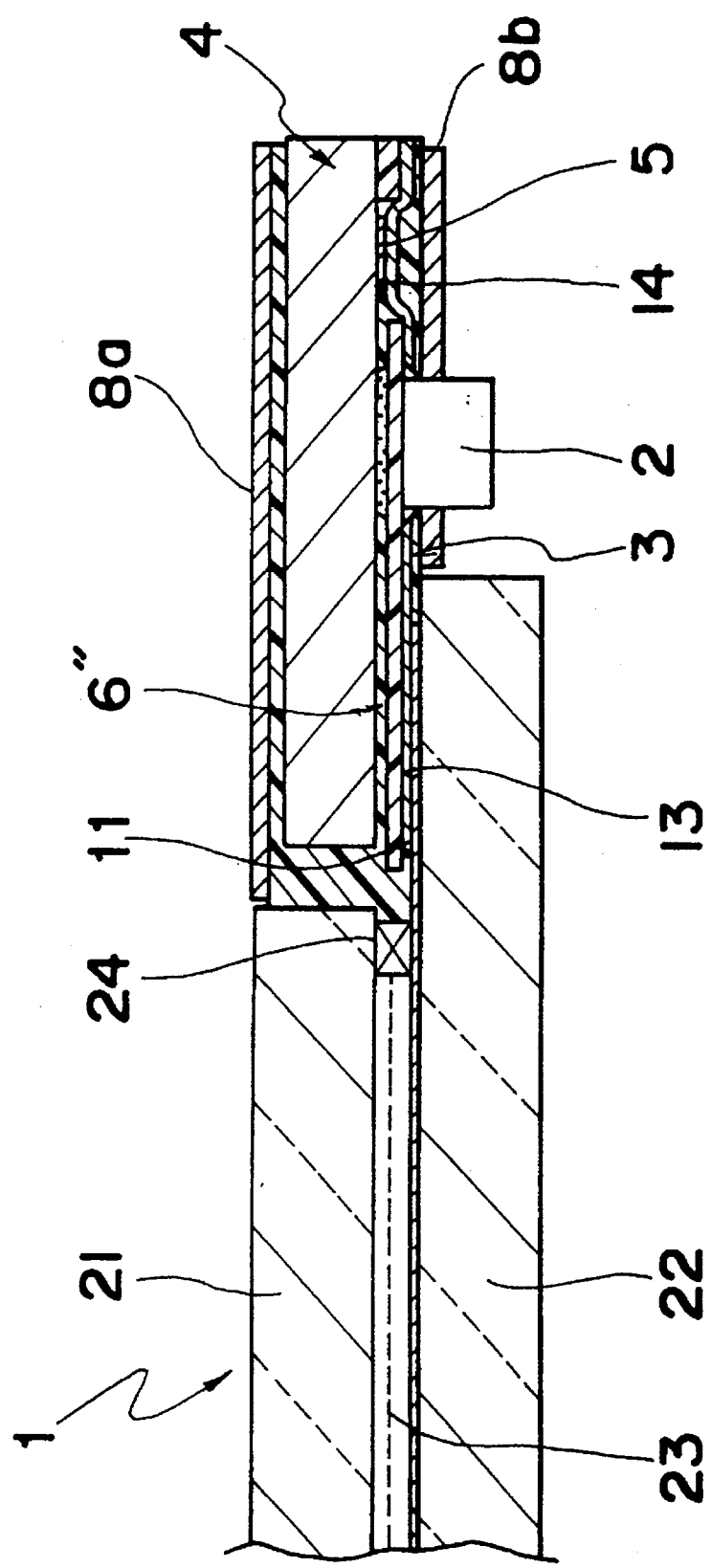
FIG. 9 is a view showing another variant of the assembly structure of the aforementioned liquid crystal display device.

Further, as shown in FIGS. 8 and 9, protective plates 7a, 7b and 8a, 8b may be provided on the surface of the resin 6" that has overflowed the clearance between the glass substrate 22 and the common wiring board 4. FIG. 8 shows an example in which protective plates 7a and 7b are provided in the clearance between the glass substrate 21 and the common wiring board 4 and that between the glass substrate 22 and the drive IC 2, respectively. On the other hand, FIG. 9 shows an example in which protective plates 8a and 8b are provided so as to cover the approximately whole regions of the upper and lower surfaces of the common wiring board 4, respectively. Thus, the protective resin 6" also covers the almost whole regions of the upper and lower surfaces of the common wiring board 4. Such an arrangement, when implemented, will further strengthen the module, allowing reduction in interstitial paths of moisture against the connecting points 11 and 13, and moreover enhancing the reliability. For the material of the protective plates 7a, 7b and 8a, 8b, for example, aluminum substrates should be adopted in view of heat radiation, light shielding, and others, or otherwise glass or copal material for making the thermal expansion coefficient approximate to that of the panel material. In addition, the protective plates may also be provided on only either one of the upper or lower surface of the common wiring board 4.

Figure 10:
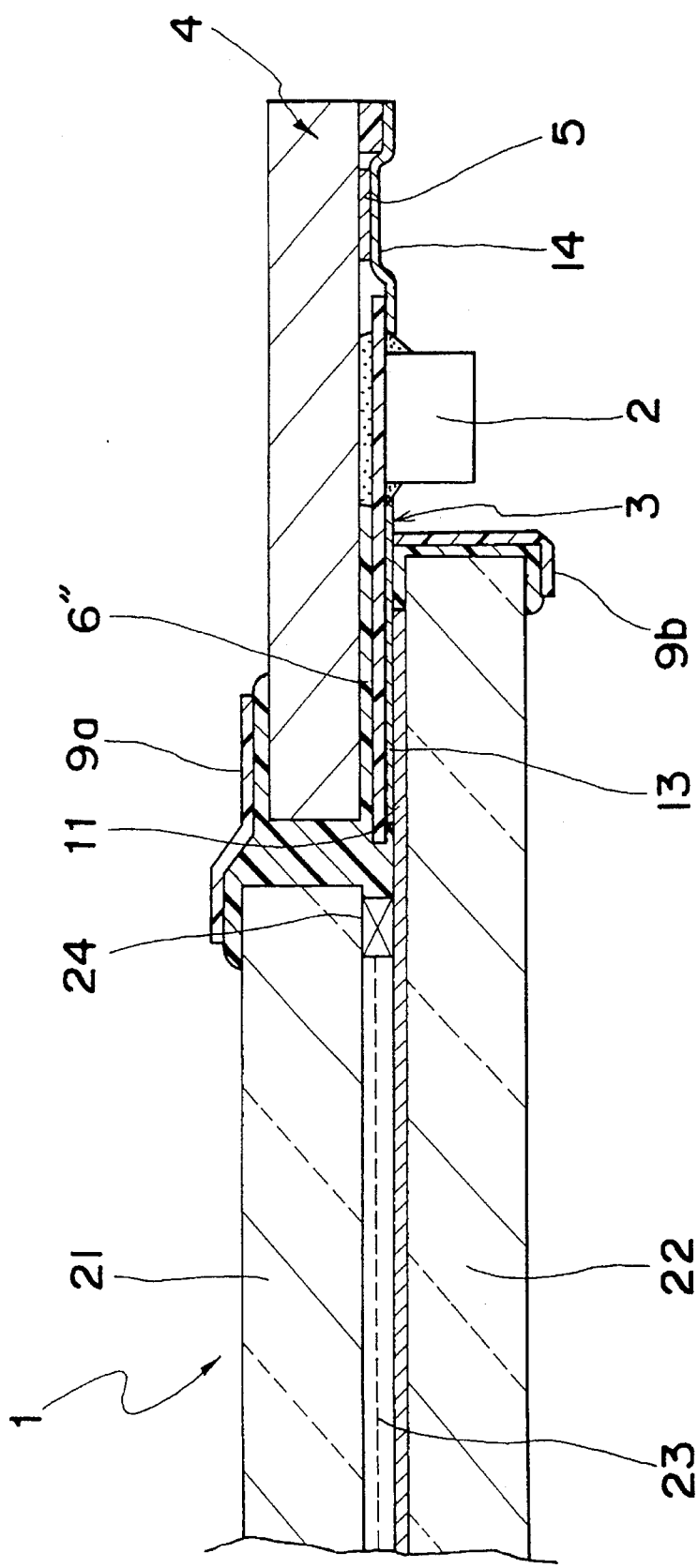
FIG. 10 is a view showing still another variant of the assembly structure of the aforementioned liquid crystal display device.

As shown in FIG. 10, the protective plates 7a, 7b and 8a, 8b may be substituted by protective members 9a and 9b composed of a flexible polyimide tape, Capton tape (trade name), Al foil, and so forth. In such a case, also, such advantages will be afforded as enhanced strength, reduction in interstitial paths of moisture to the connecting points 11 and 13, and enhanced reliability. As another case, the liquid crystal panel 1 may be mounted in the following way.

(1) First, as shown in FIG. 7A, the electrode terminals 11 of the liquid crystal panel 1 and the output terminals 13 of the flexible wiring board 3 are aligned in position, and connected to each other by means of solder or an anisotropic conductive material;

(2) Next, the liquid crystal panel 1 (or the flexible wiring board 3) and the common wiring board 4 are aligned in position;

(3) Then, in the clearance between the liquid crystal panel 1 and the common wiring board 4, more specifically, between an end face of the glass substrate 21 and an end face of the common wiring board 4 and between the peripheral portion of the glass substrate 22 and a face of the common wiring board 4, the resin 6" is dropped or applied. Thereafter the resin 6" is filled by capillary phenomenon. The resin 6" is subsequently cured. It is noted that although the dropping and curing of the resin 6" may be implemented with the aforementioned various devices, an apparatus for supplying and curing a resin which will be described later may be used for this application;

(4) Finally, the input terminals 14 of the flexible wiring board 3 and the electrode terminals 5 of the common wiring board 4 are connected to each other.

When the resin 6" is filled by capillary phenomenon as shown above, the resin 6" can be filled with high accuracy in the clearance between the liquid crystal panel 1 and the common wiring board 4, so that the amount of its overflow can be controlled with stability. Further, since less foams are involved in the resin 6" during the filling, the adhesive strength and moisture resistance can be enhanced. In consequence, the reliability of the module can be enhanced.

In addition, before supplying the resin 6" in the step (3), faulty ICs may be changed, if any, by implementing a display test of the panel. Also, the connection between the input terminals 14 of the flexible wiring board 3 and the electrode terminals 5 of the common wiring board 4, which has been implemented at the step (4) in the above case, may alternatively be done before supplying the resin 6" in the step (3), followed by a further display test of the panel.

Figure 11:
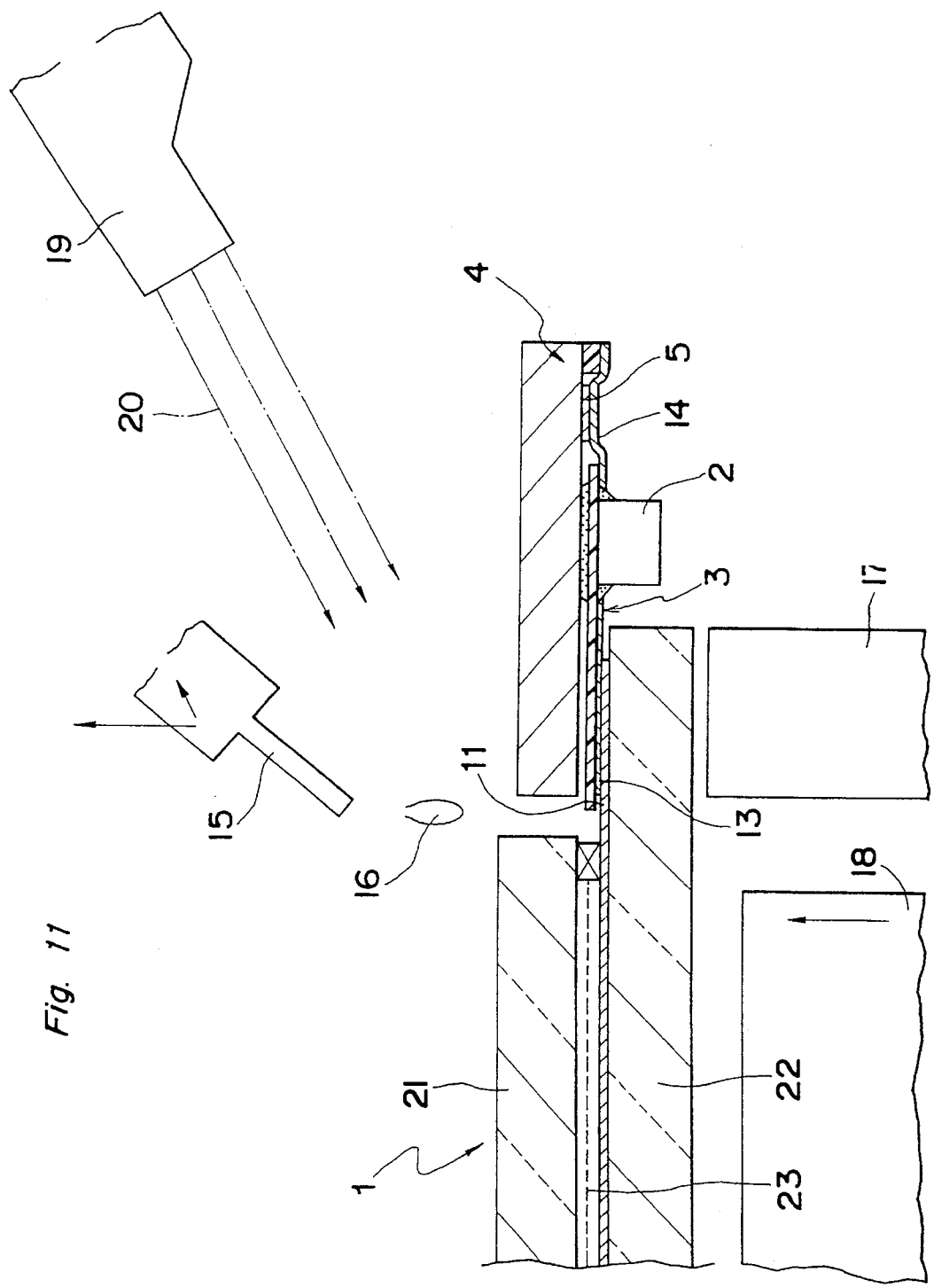
FIG. 11 is a view showing an exemplary arrangement of an apparatus for supplying and curing a resin according to the present invention.

FIG. 11 shows an exemplary arrangement of an apparatus for supplying and curing a resin according to the present invention.

This apparatus for supplying and curing a resin comprises a resin supply unit 15 in the form of needle, a heating unit 17 provided thereunder, a moving stage 18, and a resin cooling unit 19 in the form of nozzle. The resin supply unit 15 supplies the resin 16 to specified points of a member (e.g. a liquid crystal module under assembling) placed on the heating unit 17 located below. The heating unit 17, having a built-in heater, can heat at any timing the points where the resin 16 has been supplied. The moving stage 18 moves the foregoing member in either the vertical or horizontal direction. The resin cooling unit 19 can inject cooling gas 20 at any timing to the points of the foregoing member where the resin 16 has been supplied.

The supplying and curing of the resin is actually carried out in the following way:

(i) First, a member to be supplied with the resin, e.g. a liquid crystal module under assembling (but over the aforementioned step (2)) is placed on the moving stage 18. In doing this, the portion where the glass substrate 22 and the common wiring board 4 overlaps each other is placed on the heating unit 17;

(ii) Next, while moving the resin supply needle 15 along the supply line (vertical to the paper face of FIG. 11), the resin 16 is supplied by dropping it between an end face of the glass substrate 21 and an end face of the common wiring board 4. For this resin 16, a resin which will show, when heated, lower viscosity than at room temperature is used (epoxy resins have this characteristic).

(iii) Subsequently, while the points where the resin 16 has been supplied are heated by the heating unit 17 to lower the viscosity of the resin 16, thereby facilitating the capillary phenomenon, the resin 16 is filled between the peripheral portion of the glass substrate 22 and the face of the common wiring board 4. Thus, the resin 16 can be filled up in a shorter time than at room temperature; and (iv) Upon completion of the filling, the moving stage 18 is driven to lift the liquid crystal panel 1 by 10 mm or so, and cooling air 20 is sprayed from the cooling nozzle 19 to the points where the resin 16 has been filled. Thus, the resin 16 is rapidly cooled with its viscosity increased. Accordingly, the resin 16 can be prevented from flowing at an excessive amount from the clearance between the glass substrate 22 and the common wiring board 4, so that the overflowing amount of the resin can be controlled.

In addition, the apparatus for supplying and curing a resin here mentioned, needless to say, may comprise a loader for fetching a member such as the liquid crystal module into the apparatus, a positioning mechanism for positioning the fetched member onto the heating unit 17, an unloader for taking the member out of the apparatus, and so forth.

Figure 12:
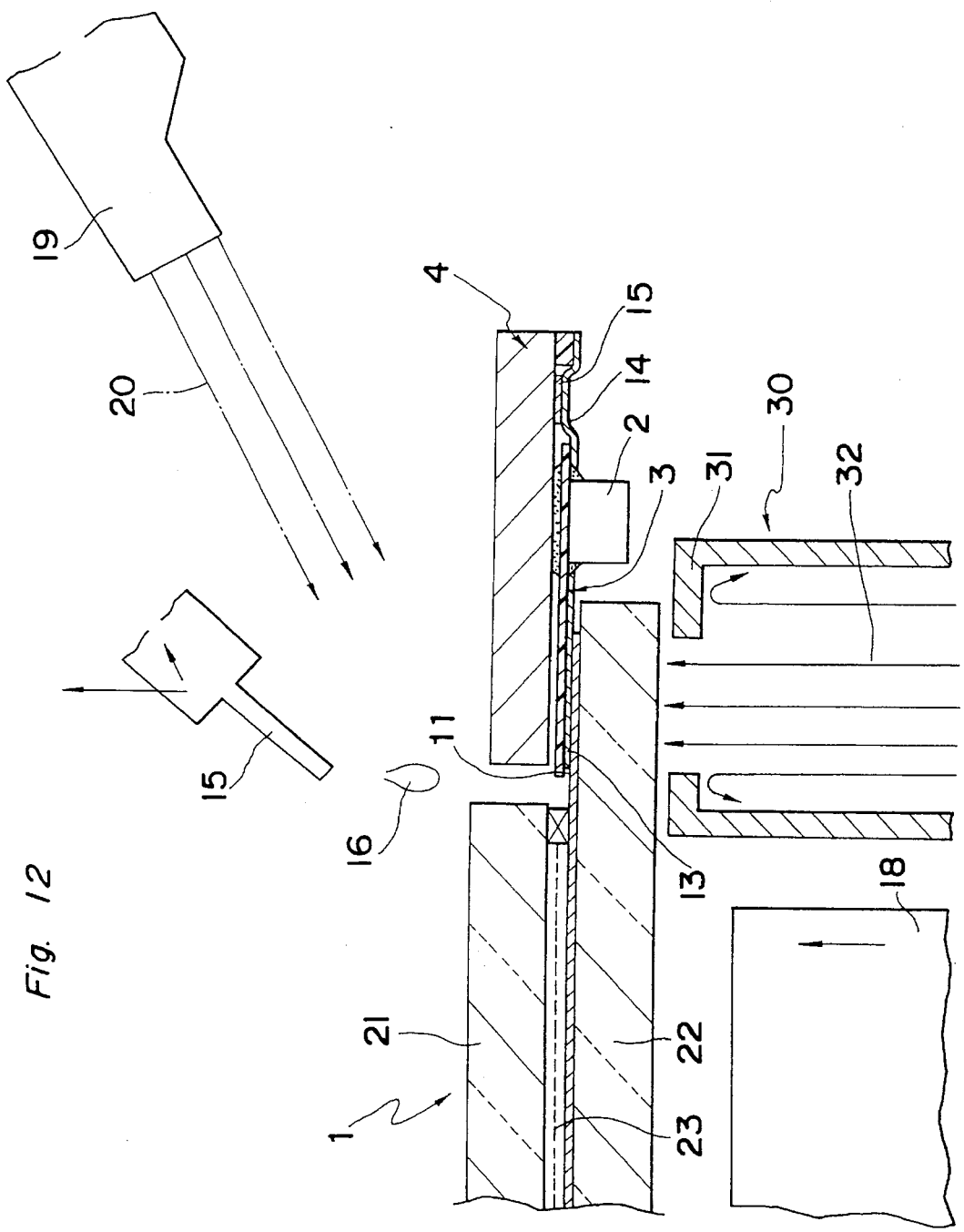
FIG. 12 is a view showing another exemplary arrangement of the apparatus for supplying and curing a resin according to the present invention.

FIG. 12 shows another exemplary arrangement of the apparatus for supplying and curing a resin according to the present invention.

This apparatus for supplying and curing a resin comprises an infrared irradiation unit 30 instead of the heating unit 17, and the other components same as shown in FIG. 11. The infrared irradiation unit 30 comprises a light source (not shown) for generating infrared rays 32, and a slit member 31 formed into a frame and having a slit on its top. The infrared light source and the slit member 31 are capable of scanning along the side of the liquid crystal panel 1.

According to the apparatus for supplying and curing a resin, at the step (iii), the resin 16 can be locally heated by the infrared rays 32 through the slit member 31. Thus, the resin 16 can be filled up in a shorter time than at room temperature. Further, by controlling the scanning rate of the slit member 31 and the infrared light source, the resin 16 can be prevented from flowing out at an excessive amount from the clearance between the glass substrate 22 and the common wiring board 4, so that the overflowing amount of the resin can be controlled. In this case, it is allowed to omit the cooling unit 19.

Further, when the infrared rays 32 are laser beams, the light intensity can be simply enhanced by increasing the output of the light source. Thus, the resin 16 can be heated with high efficiency, which leads to an increased capacity of the apparatus.

Figure 13:
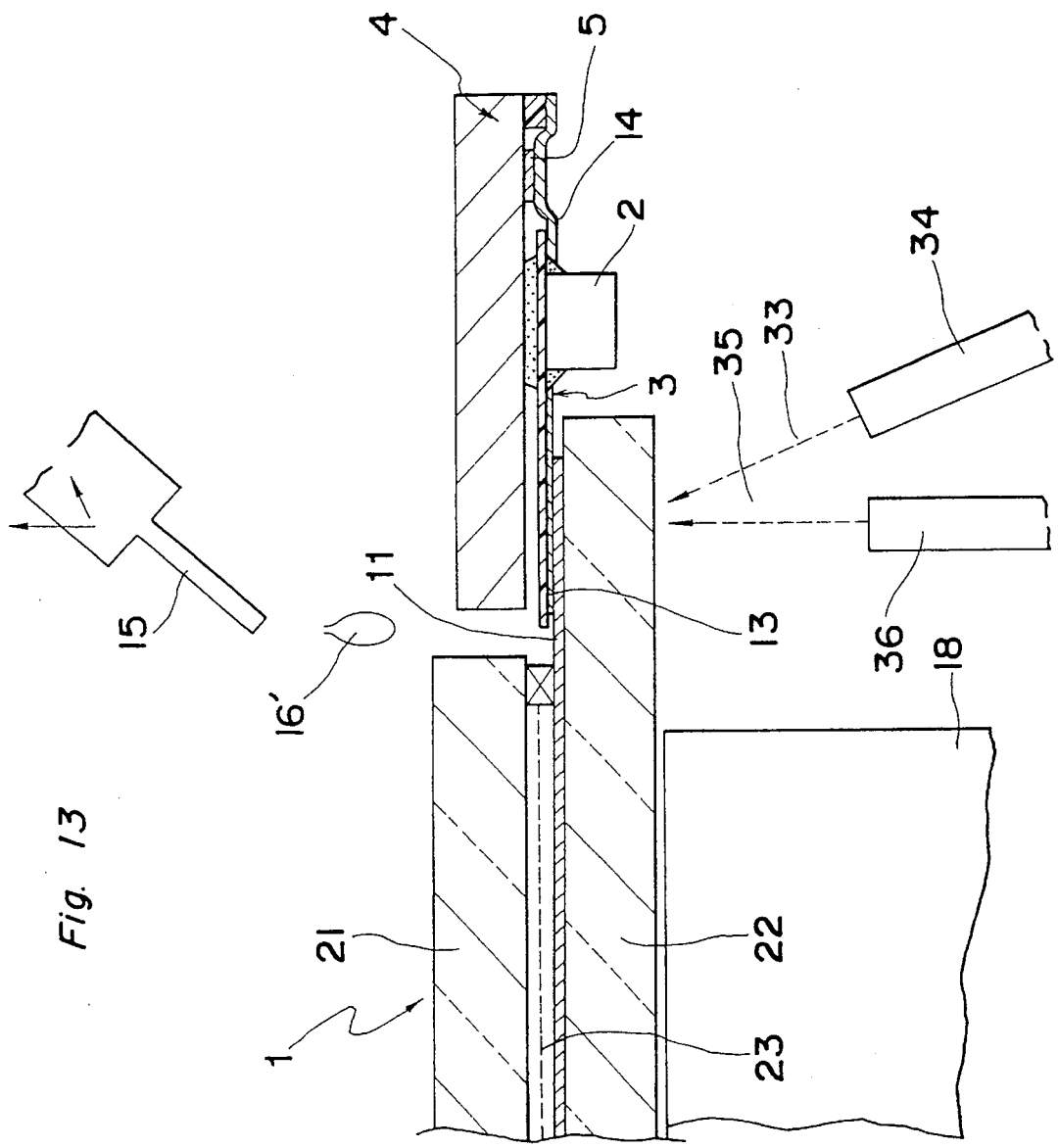
FIG. 13 is a view showing still another exemplary arrangement of the apparatus for supplying and curing a resin according to the present invention.

FIG. 13 shows still another exemplary arrangement of the apparatus for supplying and curing a resin according to the present invention.

This apparatus for supplying and curing a resin comprises an optical fiber 34 for irradiating infrared rays 33 to points where the resin has been supplied, instead of the heating unit 17, and further an optical fiber 36 for irradiating ultraviolet rays 35. It is arranged that the ends of the optical fibers 34 and 36 can be scanned independently of each other in the direction along the side of the liquid crystal panel 1.

The apparatus for supplying and curing a resin here mentioned employs a resin 16' which will be cured by irradiating the ultraviolet rays 35 of specific wavelengths. According to this apparatus, the resin 16' can be locally heated by the infrared rays 33 through the optical fiber 34, at the aforementioned step (iii). Thus, the resin 16' can be filled up in a shorter time than at room temperature. Further, by controlling the scanning rate of the end of the optical fiber 34, the resin 16' can be prevented from flowing out at an excessive amount from the clearance between the glass substrate 22 and the common wiring board 4, so that the overflowing amount of the resin can be controlled. Subsequently, while the end of the optical fiber 36 is being scanned along the side of the panel 1, the ultraviolet rays 35 are irradiated to the points where the resin 16' has been filled. Thus, the resin 16' can be cured in a short time.

It is noted that although the above description of each apparatus for supplying and curing a resin has been made upon the case in which the resin is cured during the mounting process of the liquid crystal panel 1, yet of course it is not limited to this. The apparatus for supplying and curing a resin according to the present invention lend themselves to a wide variety of applications including the interface-resin injection process in the assembling of various other types of electronic components and parts, for example in Chip On Glass mounting or Flip Chip mounting.

As apparent from the above description, the assembly structure according to the first aspect of the invention is such that the panel and the common wiring board are mounted on each other so as to overlap each other; therefore, the area of the peripheral region can be reduced by their overlapping portions. As a result, the device can be assembled compactly. Further, the faces on which the electrode terminals of the panel and those of the common wiring board are provided are opposed to each other and the electrode terminals of the common wiring board are located outside of the peripheral portion of the panel; therefore, by providing the flexible wiring board in the clearance between the panel and the common wiring board, the electrode terminals of the panel and those of the common wiring board can be connected at minimum distances. In consequence of this, the device can be assembled compactly without the need of drawing the flexible wiring board long around.

Moreover, when the drive IC is secured to a surface of the flexible wiring board opposite to a surface of the flexible wiring board where the common wiring board is mounted, in a state that the drive IC is located outside of the peripheral portion of the panel, the assembly's total thickness will not be increased due to the thickness of the drive IC. Accordingly, the device can be assembled compactly.

The assembly structure according to the second aspect of the invention is such that the panel and the common wiring board are mounted on each other so as to overlap each other; therefore, the area of the peripheral region can be reduced by their overlapping portion. Further, the panel and the common wiring board are secured integrally with a bonding material without using a thick frame; therefore, the thickness of the module can be lessened accordingly. As a result, the module i.e. device can be assembled more compactly relative to the conventional type. Yet further, the electrode terminals of the common wiring board are located outside of the peripheral portion of the panel; therefore, by providing the flexible wiring board in the clearance between the panel and the common wiring board, the electrode terminals of the panel and those of the common wiring board can be connected at minimum distances. As a result, the device can be assembled compactly without the need of drawing the flexible wiring board long around. Also, since the panel and the common wiring board are integrally secured with a bonding material, the strength of the module and therefore its reliability are enhanced, and any excessive members such as a frame may be omitted. In consequence, the material cost and manpower required can be reduced accordingly, and thus the device can be assembled with high reliability and low cost.

Moreover, when the drive IC is secured on a surface of the flexible wiring board opposite to a surface of the wiring board where the common wiring board is mounted in a state that the drive IC is located outside of the peripheral portion of the liquid crystal panel, the assembly's total thickness will not be increased by the thickness of the drive IC. Accordingly, the device can be assembled compactly.

The assembly structure according to the third aspect of the invention is such that the panel and the common wiring board are mounted on each other so as to overlap each other; therefore, the area of the peripheral region can be reduced by their overlapping portion. As a result, the module can be assembled compactly. Further, since the panel, the flexible wiring board, and the common wiring board are integrated by bonding them together with a protective resin, the need of providing a thick frame and the like is eliminated, allowing the thickness of the module to be reduced accordingly. As a result, the module can be assembled thin and compactly. Also, the faces on which electrode terminals of the panel and those of the common wiring board are provided are opposed to each other and the electrode terminals of the common wiring board are located outside of the peripheral portion of the panel; therefore, by providing the flexible wiring board in the clearance between the panel and the common wiring board, the electrode terminals of the panel and those of the common wiring board can be connected at minimum distances. As a result of this, the module can be assembled compactly without the need of drawing the flexible wiring board long around. Yet further, since the panel, the flexible wiring board, and the common wiring board are integrally secured with a protective resin, the strength of the module is enhanced, with the result of increased reliability. Moreover, such excessive members as a frame may be omitted and therefore the material cost and manpower required can be reduced accordingly. In consequence, the module can be assembled with low cost.

By the method of assembling a flat type device according to the fourth aspect of the invention, a flat type device including a panel, such as a liquid crystal panel, on which electrode terminals are disposed on its periphery can be assembled thin and compactly and yet with low cost.

When a surface of the common wiring board opposite to a surface of the common wiring board where the electrode terminals is provided faces the panel and the portion of the flexible wiring board on the common wiring board side is wound around the peripheral portion of the common wiring board to be connected to the electrode terminals of the common wiring board, the width of the common wiring board can be reduced by the extent of the electrode terminals. Accordingly, the area of the peripheral region of the panel can be further reduced. In consequence of this, the size of the casing to be attached to the periphery of the panel can be reduced.

Also, since a bonding device of a back-pressure beam type infrared irradiation system is used for the process of curing an anisotropic conductive material as a bonding material, the anisotropic conductive material can be locally heated and pressurized. This allows, especially when bonding the panel and the common wiring board, prevention of thermal stress from being applied to the connecting portion between the panel and the flexible wiring board, which have already been connected. As a result, the reliability of the module can be enhanced.

By the assembling method according to the fifth or sixth aspect of the invention, a flat type device including a panel, such as a liquid crystal panel, on which electrode terminals are disposed on its periphery, can be assembled thin and compactly and yet With low cost and high reliability.

By the apparatus for supplying and curing a resin according to the seventh aspect of the invention, a resin can be supplied into a clearance of such a member as an assembly of electronic components and cured in a short time. In consequence, assemblies of electronic components and other like devices can be simply fabricated in a short time.

Further, by the method of supplying and curing a resin according to the eighth or ninth aspect of the invention, a resin can be supplied into a clearance of such a member as an assembly of electronic components and cured in a short time. In consequence, assemblies of electronic components and other like devices can be simply fabricated in a short time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of assembling a flat type display device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of:

making an anisotropic conductive material adhering to a single or a plurality of points within the face of the panel on an electrodes terminals side of the panel through heating and pressurization;

aligning the flexible wiring board with the aforementioned face of the panel;

connecting the panel and the flexible wiring board with each other by locally heating and pressurizing part of the anisotropic conductive material that exists in the region where the panel and the flexible wiring board overlap each other;

causing the panel and the common wiring board to overlap each other so that the electrode terminals of the common wiring board are located outside of the peripheral portion of the panel and then aligning the flexible wiring board and the common wiring board with each other;

mounting and integrating the panel and the common wiring board by locally heating and pressurizing part of the anisotropic conductive material that exists in the region where the panel and the common wiring board overlap each other without intervention of the flexible wiring board; and electrically connecting the flexible wiring board and the common wiring board to each other.

2. A method of assembling a flat type device as claimed in claim 1, wherein in the step of causing the panel and the common wiring board to overlap each other, a face of the common wiring board having the electrode terminals is positioned so as not to face the panel and wherein in the step of connecting the flexible wiring board and the common wiring board with each other, the portion of the flexible wiring board on the side of the common wiring board is connected to the electrode terminals of the common wiring board by winding the flexible wiring board around a peripheral portion of the common wiring board.

3. A method of assembling a flat type device as claimed in claim 1, wherein the connection between the panel and the flexible wiring board and the mounting of the panel and the common wiring board are carried out by using a bonding device of a back-pressure beam type infrared irradiation system.

4. A method of assembling a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of:

aligning the flexible wiring board with the face of the panel and then electrically connecting the panel and the flexible wiring board to each other;

applying a protective resin onto the peripheral portion of the panel or onto the common wiring board;

causing the panel and the common wiring board to overlap each other so that the electrode terminals of the common wiring board are located in outer proximity to the peripheral portion of the panel and then aligning the panel or the flexible wiring board with the common wiring board; and curing the protective resin, thereby bonding and integrating together the panel, the flexible wiring board, and the common wiring board with the protective resin, and then electrically connecting the flexible wiring board and the common wiring board.

5. A method of assembling a panel as claimed in claim 4, further comprising the step of: temporarily heating the protective resin to thereby lower viscosity of the protective resin and then cooling the protective resin, after the step of aligning the panel or the flexible wiring board with the common wiring board and before the step of curing the resin.

6. A method of assembling a flat type device as claimed in claim 4, wherein an epoxy resin is used as the protective resin.

7. A method of assembling a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of:

aligning the flexible wiring board with the face of the panel and then electrically connecting the panel and the flexible wiring board to each other;

causing the panel and the common wiring board to overlap each other so that the electrode terminals of the common wiring board are located in outer proximity to the peripheral portion of the panel and then aligning the panel or the flexible wiring board with the common wiring board;

supplying a protective resin to the vicinity of a clearance between the panel and the common wiring board, thereby filling the protective resin into the clearance by capillary phenomenon; and curing the protective resin, thereby bonding and integrating together the panel, the flexible wiring board, and the common wiring board with the protective resin, and then electrically connecting the flexible wiring board and the common wiring board.

8. A method of assembling a flat type device as claimed in claim 7, wherein during the process of filling the protective resin into the clearance between the panel and the common wiring board by capillary phenomenon, the protective resin is temporarily heated to thereby lower viscosity of the protective resin and subsequently cooled.

9. A method of assembling a flat type device as claimed in claim 7, wherein an epoxy resin is used as the protective resin.

10. A method of assembling a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of:

aligning the flexible wiring board with the face of the panel and then electrically connecting the panel and the flexible wiring board to each other;

applying a protective resin onto the peripheral portion of the panel or onto the common wiring board;

causing the panel and the common wiring board to overlap each other so that the electrode terminals of the common wiring board are located in outer proximity to the peripheral portion of the panel and then aligning the panel or the flexible wiring board with the common wiring board; and electrically connecting the flexible wiring board and the common, wiring board, and then curing the protective resin, thereby bonding and integrating together the panel, the flexible wiring board, and the common wiring board with the protective resin.

11. A method of assembling a flat type device, in which a panel has electrode terminals on periphery of one face of the panel, a flexible wiring board has a drive IC mounted on the flexible wiring board for driving the panel, a common wiring board has electrode terminals on one face of the common wiring board, the flexible wiring board is electrically connected to the electrode terminals of the panel, and the common wiring board is electrically connected to the flexible wiring board so as to transmit an input signal, which has been received by the electrode terminals of the common wiring board from external, to the drive IC, the method comprising the steps of:

aligning the flexible wiring board with the face of the panel and then electrically connecting the panel and the flexible wiring board to each other;

causing the panel and the common wiring board to overlap each other so that the electrode terminals of the common wiring board are located in outer proximity to the peripheral portion of the panel and then aligning the panel or the flexible wiring board with the common wiring board;

supplying a protective resin to the vicinity of a clearance between the panel and the common wiring board, thereby filling the protective resin into the clearance by capillary phenomenon; and electrically connecting the flexible wiring board and the common wiring board, and then curing the protective resin, thereby bonding and integrating together the panel, the flexible wiring board, and the common wiring board with the protective resin.

* * * * *